US012621992B2

(12) United States Patent
Kondo

(10) Patent No.: US 12,621,992 B2
(45) Date of Patent: May 5, 2026

(54) SEMICONDUCTOR MEMORY DEVICE

(71) Applicant: Kioxia Corporation, Tokyo (JP)

(72) Inventor: Takaaki Kondo, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 1088 days.

(21) Appl. No.: 17/654,659

(22) Filed: Mar. 14, 2022

(65) Prior Publication Data

US 2023/0084863 A1 Mar. 16, 2023

(30) Foreign Application Priority Data

Sep. 13, 2021 (JP) ................................. 2021-148487

(51) Int. Cl.
H10B 43/27 (2023.01)
H10B 41/27 (2023.01)

(52) U.S. Cl.
CPC ............. H10B 43/27 (2023.02); H10B 41/27 (2023.02)

(58) Field of Classification Search
CPC ........ H10B 43/10; H10B 43/27; H10B 43/35; H10B 41/27; H10B 12/00; H10B 12/01; H10B 41/10; H10B 41/43; H10B 43/30; H10B 41/35; H10B 41/30; G11C 16/0483; G11C 16/08; G11C 16/26; H10D 64/037; H10D 62/292; H10D 30/0212; H10D 30/693; H10D 62/83; H10D 62/151; H10D 64/035; H10D 64/62; H10D 64/017; H10P 50/283
See application file for complete search history.

(56) References Cited

U.S. PATENT DOCUMENTS

| | | | |
|---|---|---|---|
| 2017/0194345 A1 | 7/2017 | Nojima | |
| 2018/0047748 A1 | 2/2018 | Choi et al. | |
| 2020/0075621 A1* | 3/2020 | Nakaki | H10B 43/27 |
| 2020/0161325 A1* | 5/2020 | Clampitt | H10B 43/10 |

FOREIGN PATENT DOCUMENTS

| | | | | |
|---|---|---|---|---|
| CN | 111668228 A | * | 9/2020 | H10B 43/10 |

OTHER PUBLICATIONS

Xu et al (CN 111668228), Sep. 15, 2020 Translation (Year: 2020).*

* cited by examiner

*Primary Examiner* — Jessica S Manno
*Assistant Examiner* — Victor Joseph Lasasso
(74) *Attorney, Agent, or Firm* — Oblon, McClelland, Maier & Neustadt, L.L.P.

(57) ABSTRACT

A semiconductor memory device according to an embodiment includes a first member and a plurality of pillars. The first member includes a first portion which is arranged locally on an upper end side and intermittently in a second direction. The plurality of pillars include first to sixth pillars. The second pillar is adjacent to the first pillar. The third pillar faces a first region between the first and second pillars. The fourth pillar is adjacent to the third pillar. The fifth pillar faces a second region between the third and fourth pillars. The sixth pillar is adjacent to the fifth pillar. A first end of the first portion faces the first region. The first to third regions are positioned on an identical straight line. The third region is between the fifth and sixth pillars.

16 Claims, 31 Drawing Sheets

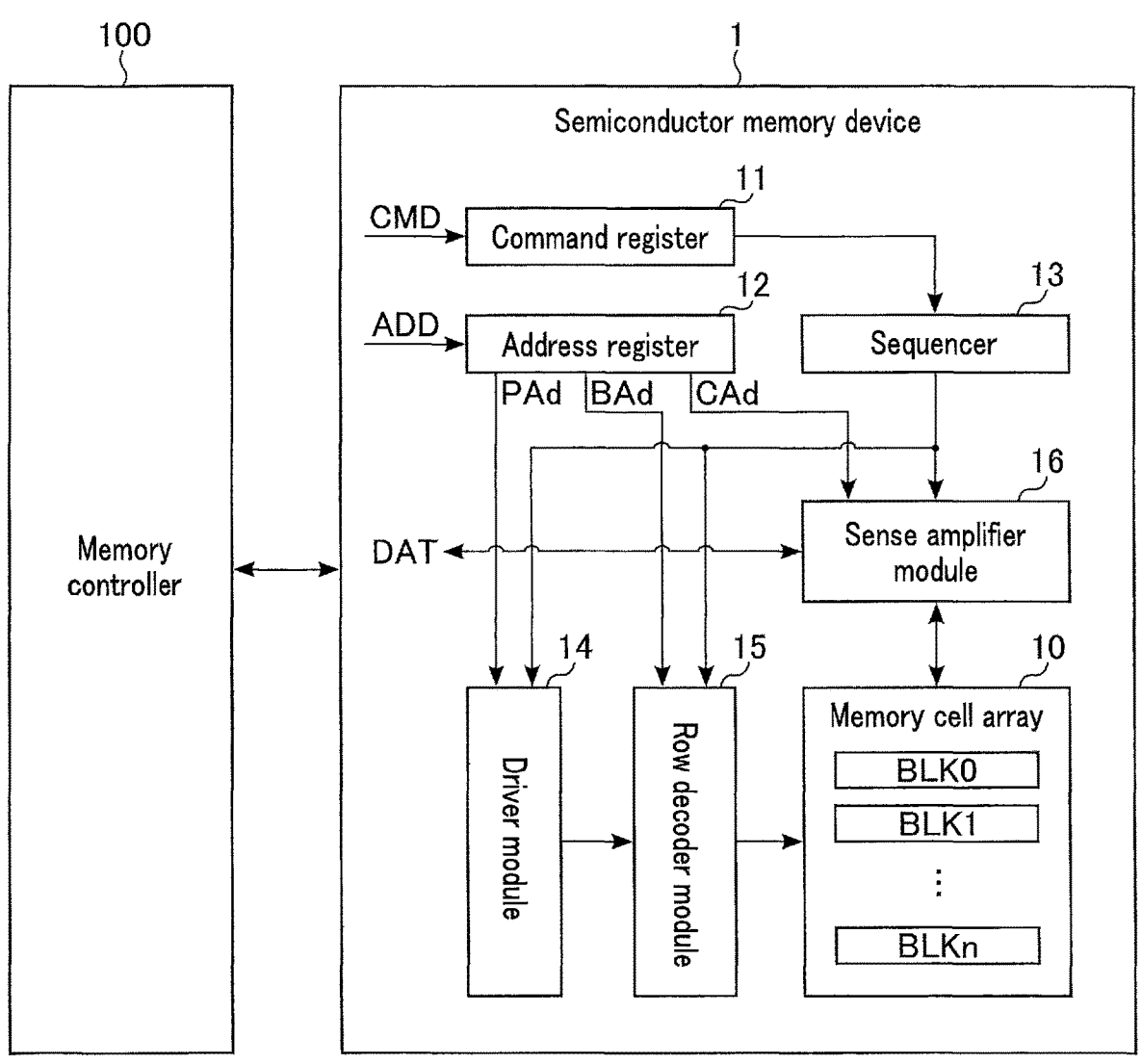
F I G. 1

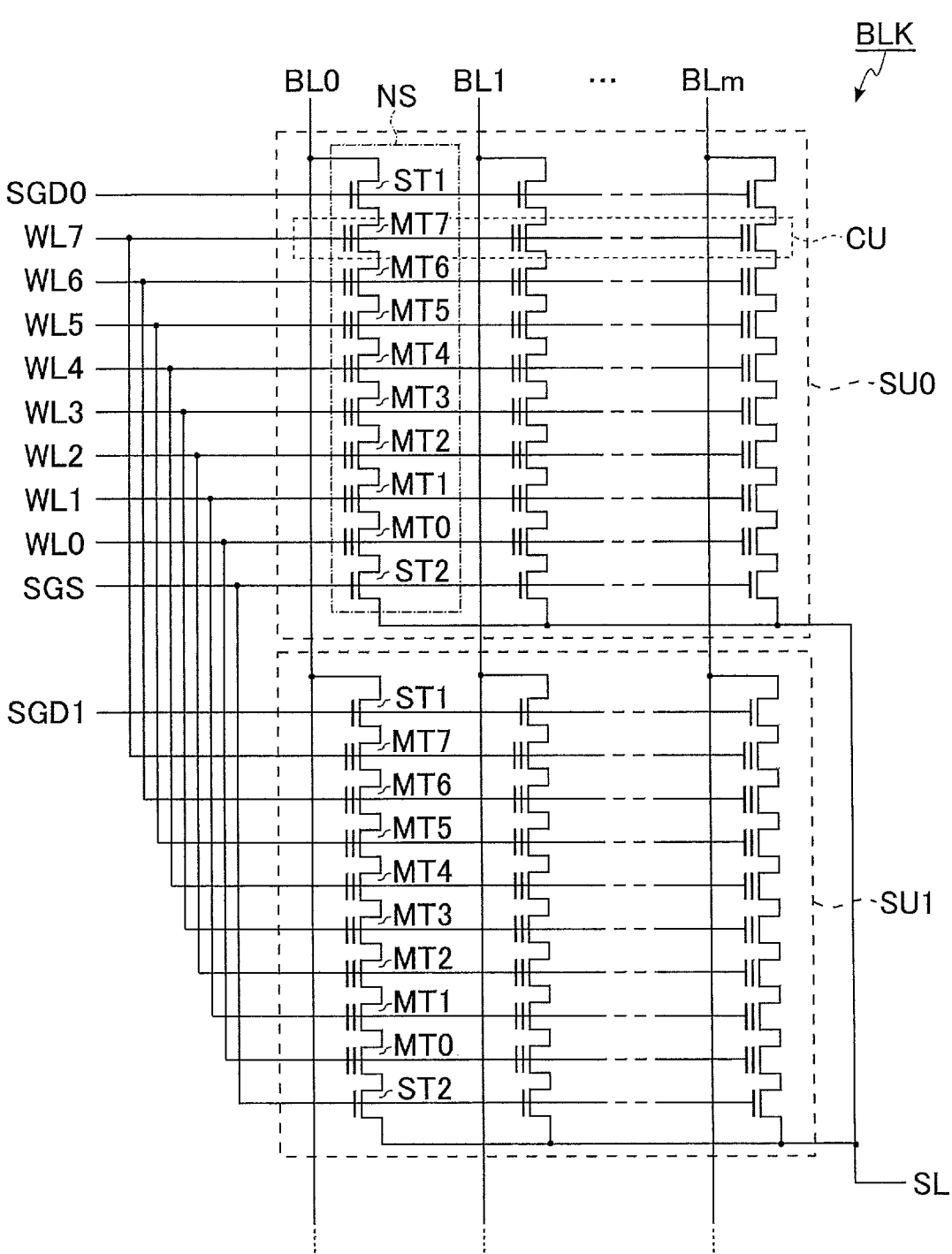
F I G. 2

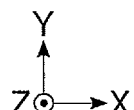
F I G. 3

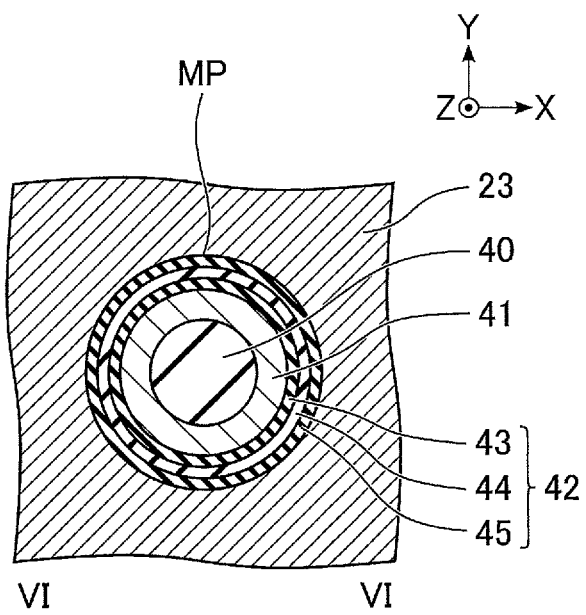
F I G. 6

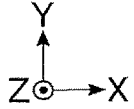
F I G. 7

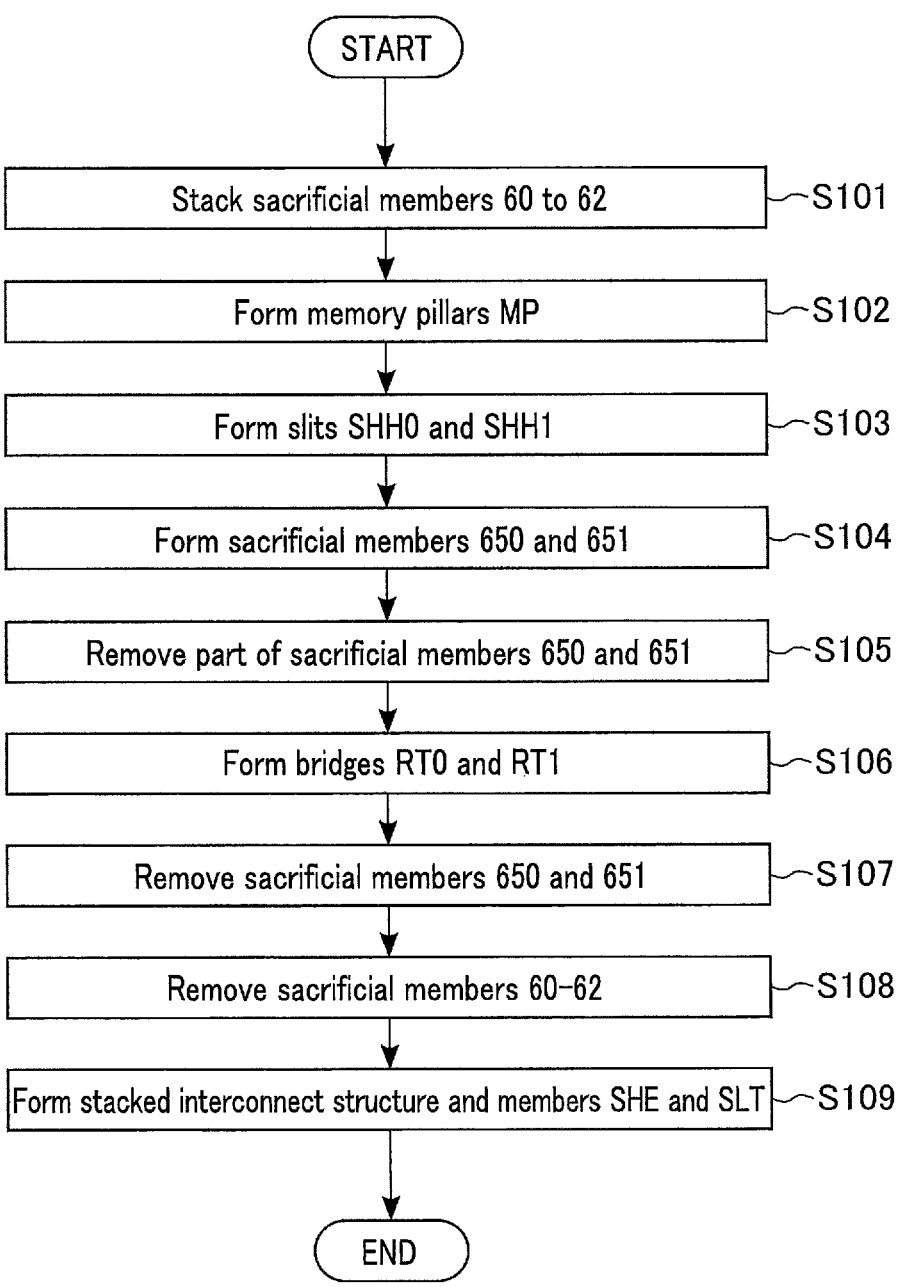
START
Stack sacrificial members 60 to 62 ——S101
Form memory pillars MP ——S102
Form slits SHH0 and SHH1 ——S103
Form sacrificial members 650 and 651 ——S104
Remove part of sacrificial members 650 and 651 ——S105
Form bridges RT0 and RT1 ——S106
Remove sacrificial members 650 and 651 ——S107
Remove sacrificial members 60–62 ——S108
Form stacked interconnect structure and members SHE and SLT ——S109
END
F I G. 8

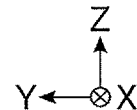
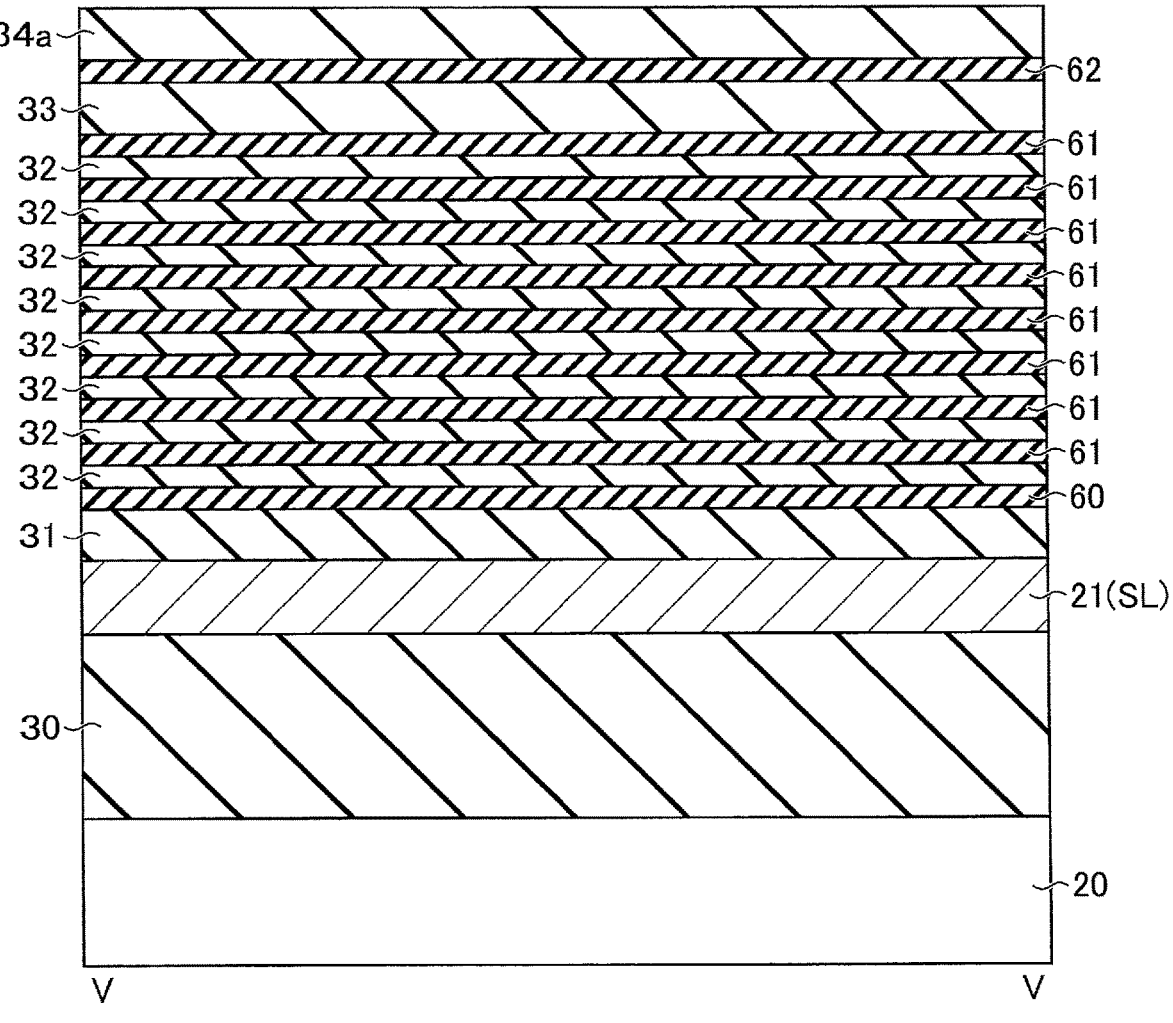
F I G. 9

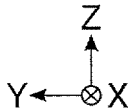
$$Z$$
$$Y \leftarrow \otimes X$$
MP
34 { 34b
     34a
ST1
33
32    MT7    —61
32    MT6    —61
32    MT5    —61
32    MT4    —61
32    MT3    —61
32    MT2    —61
32    MT1    —61
32    MT0    —61
32    ST2    —60
31
21
(SL)
40  41  42
30
20
V                                    V
F I G. 10

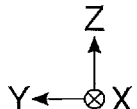
650    MP    651
34
ST1    62
33    MT7    61
32    MT6    61
32    MT5    61
32    MT4    61
32    MT3    61
32    MT2    61
32    MT1    61
32    MT0    61
32    ST2    60
31
21
(SL)
40  41  42
30
20
V    V
F I G. 12

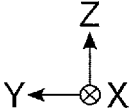
F I G. 13

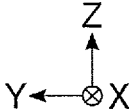
RT0　　　　　　　　　　　　　　　MP　　RT1
34
ST1　　　　　　　　　　　　　62
33
MT7　　　　　　　　　　61
32　　MT6　　　　　　　61
32　　MT5　　　　　　　61
32　　MT4　　　　　　　61
32　　MT3　　　　　　　61
32　　MT2　　　　　　　61
32　　MT1　　　　　　　61
32　　MT0　　　　　　　61
32　　ST2　　　　　　　60
31　　　　　　　　　　651
650　　　　　　　　　　21
　　　　　　　　　　　　(SL)
40　41　42
30
20
F I G. 15

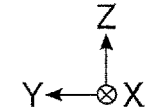
F I G. 19

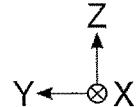
F I G. 20

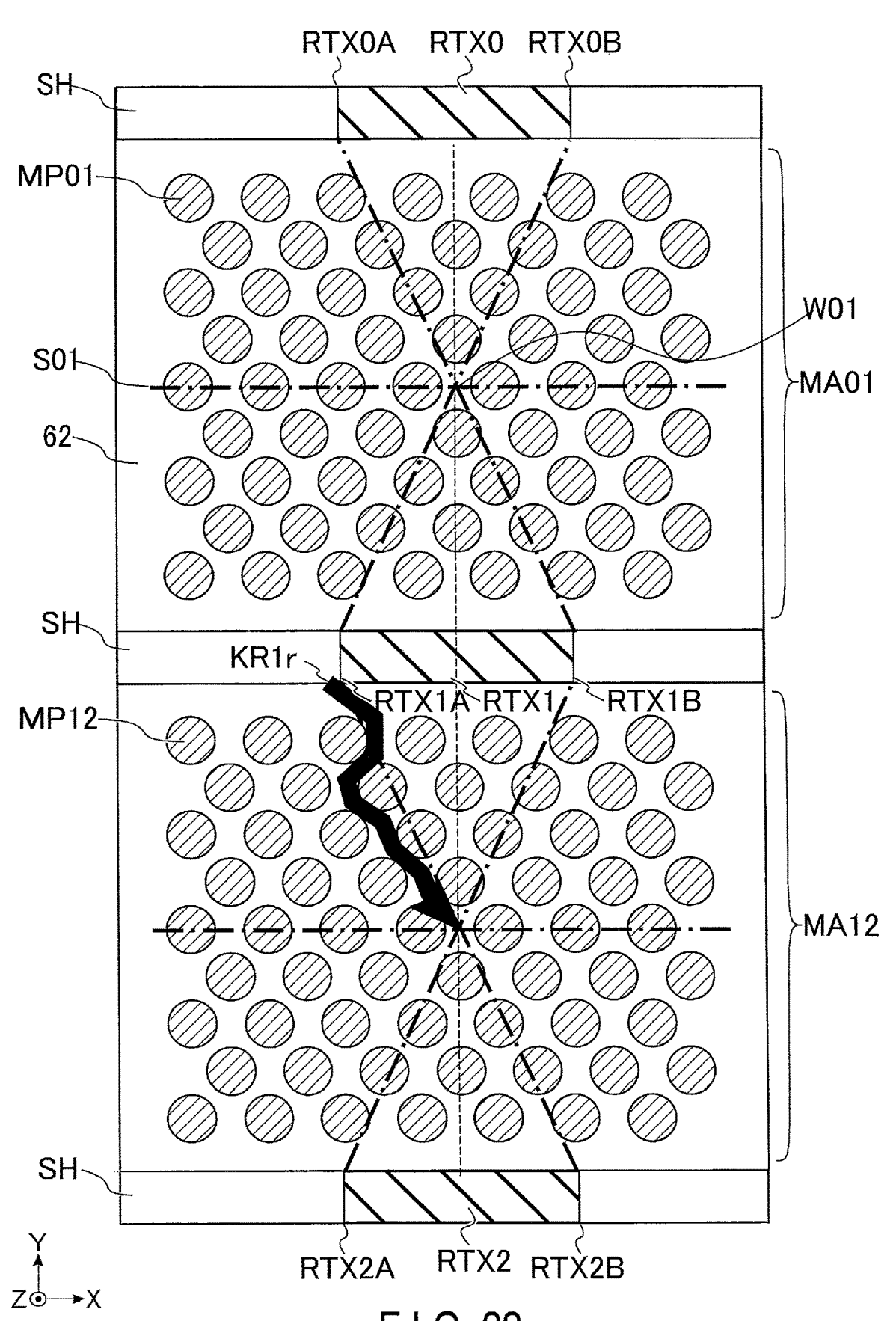
F I G. 22

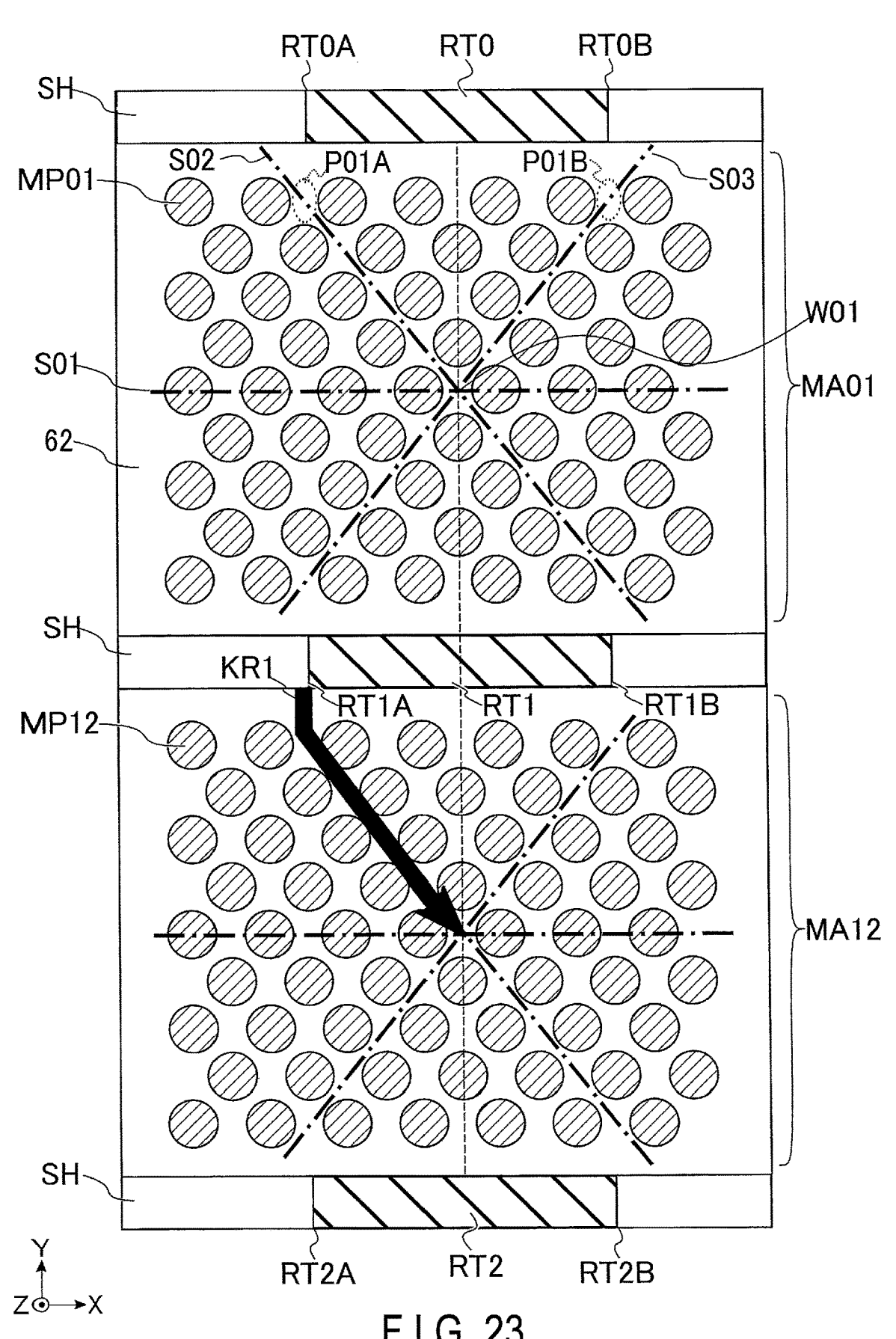
F I G. 23

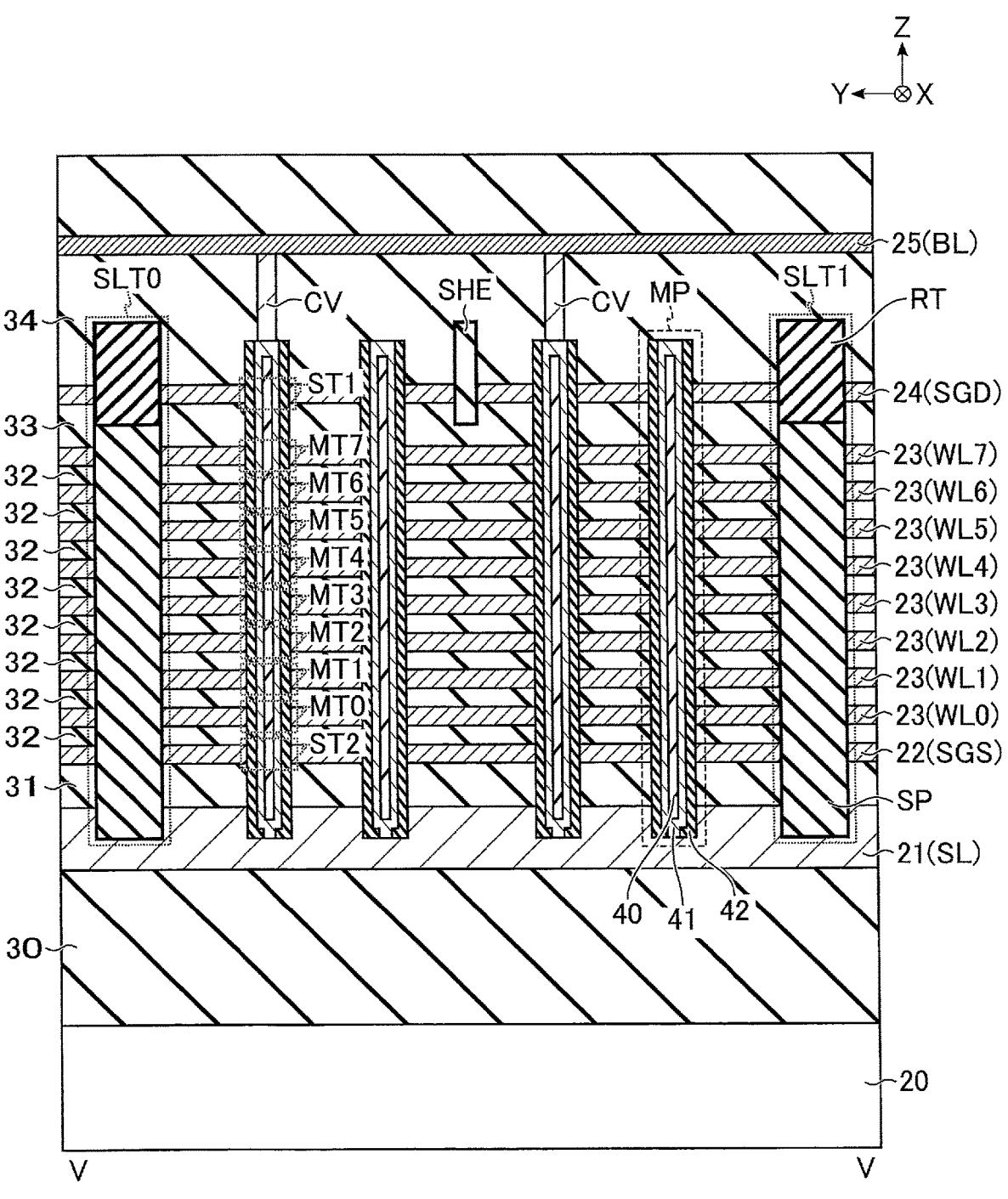
F I G. 24

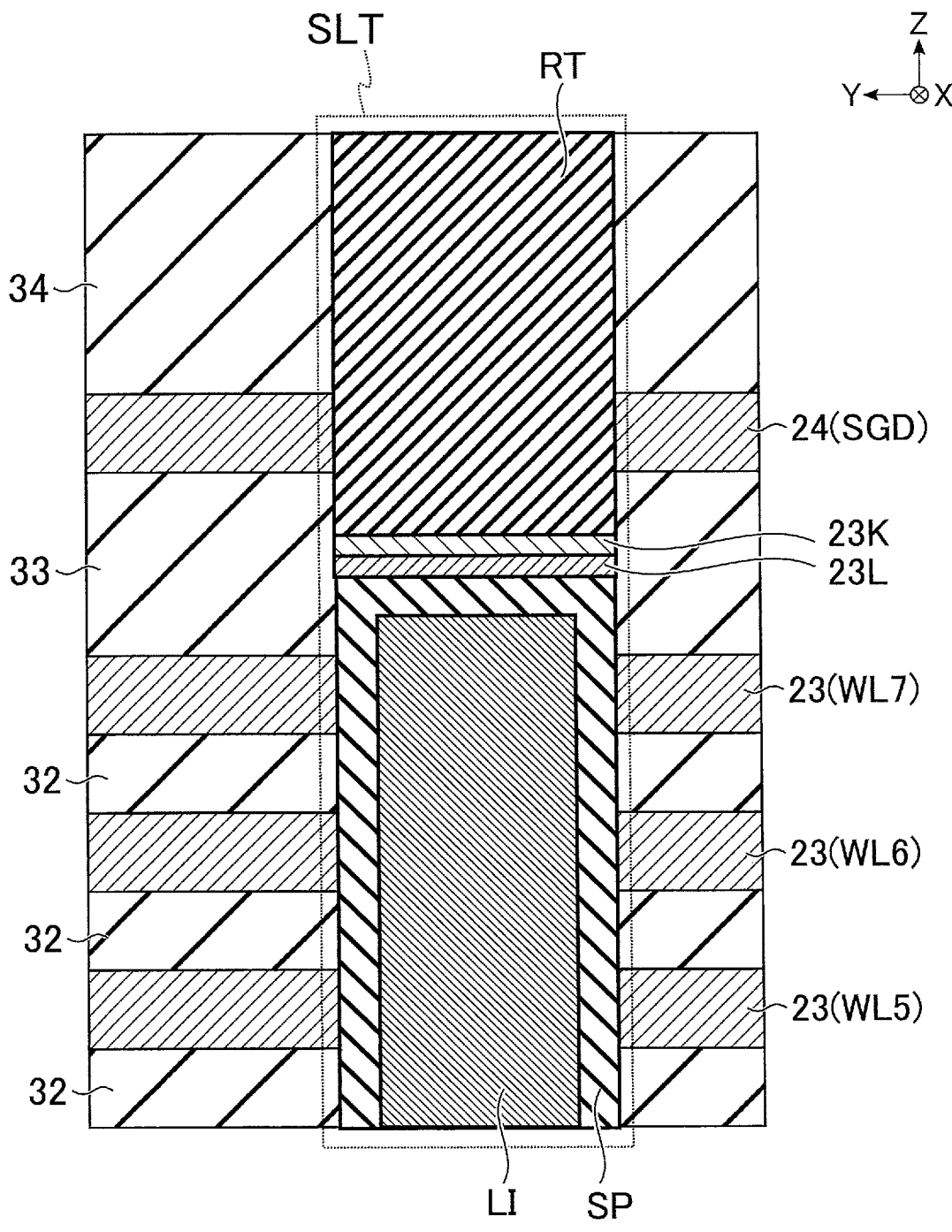
F I G. 26

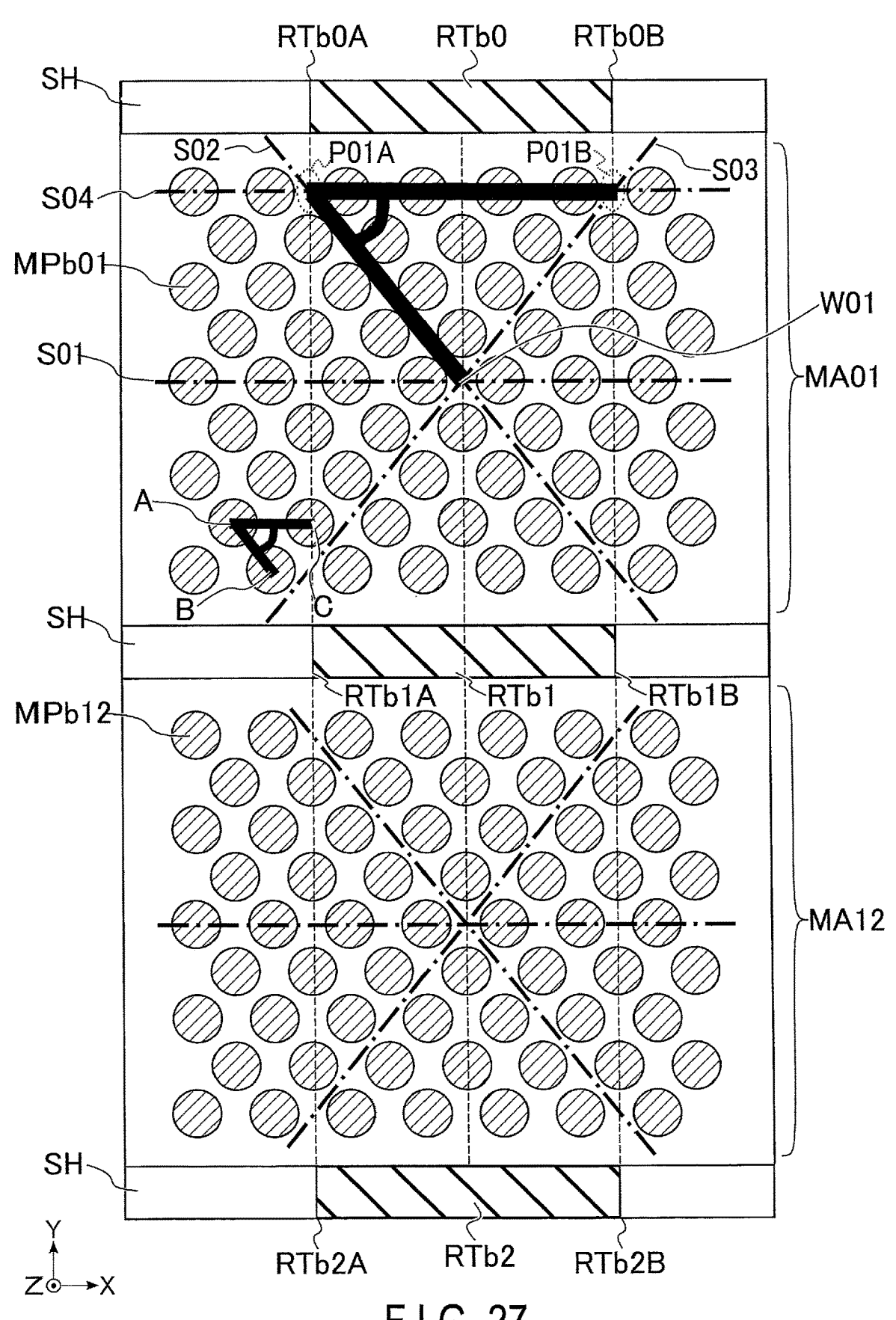
F I G. 27

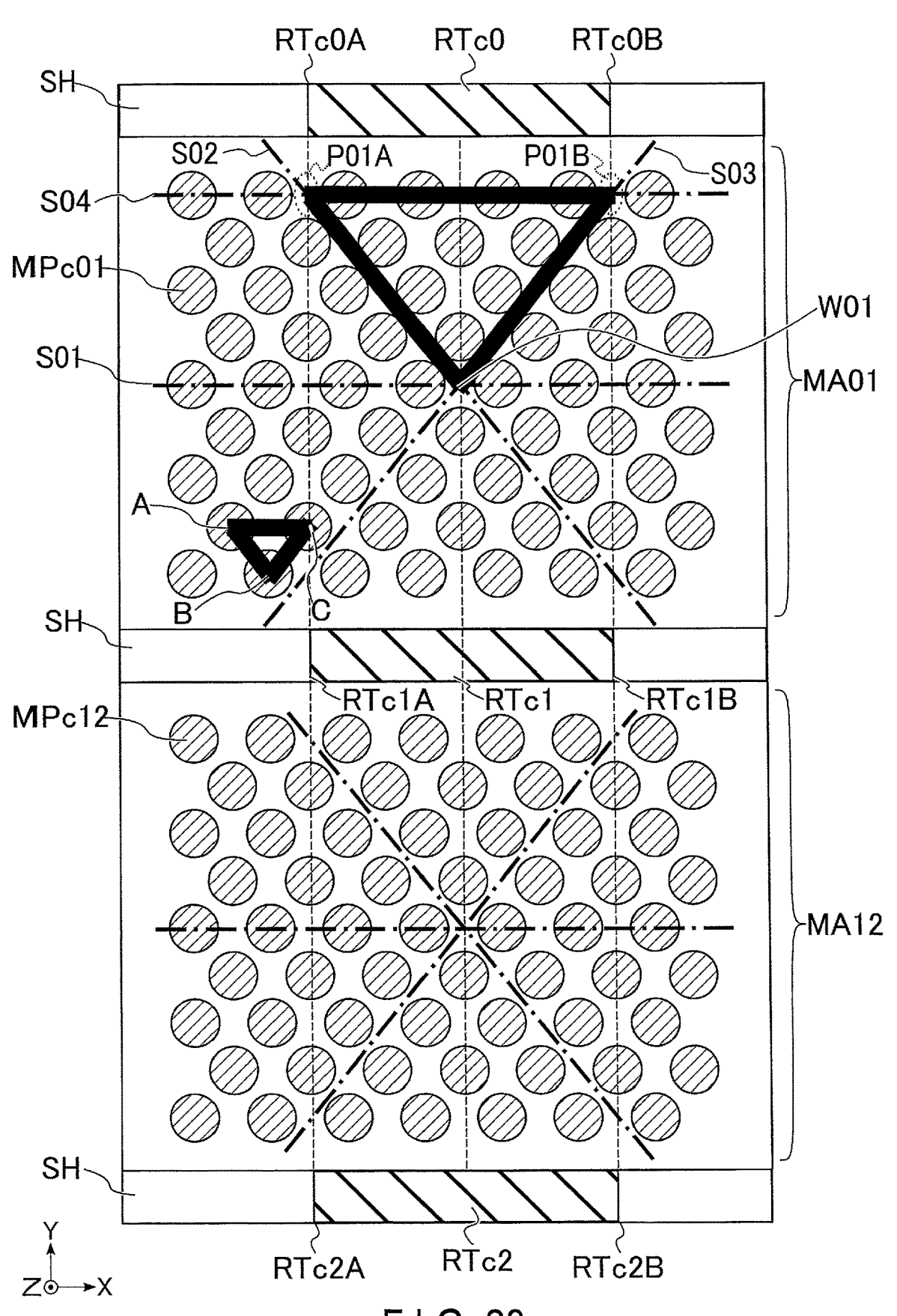
F I G. 28

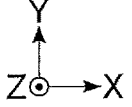
F I G. 29

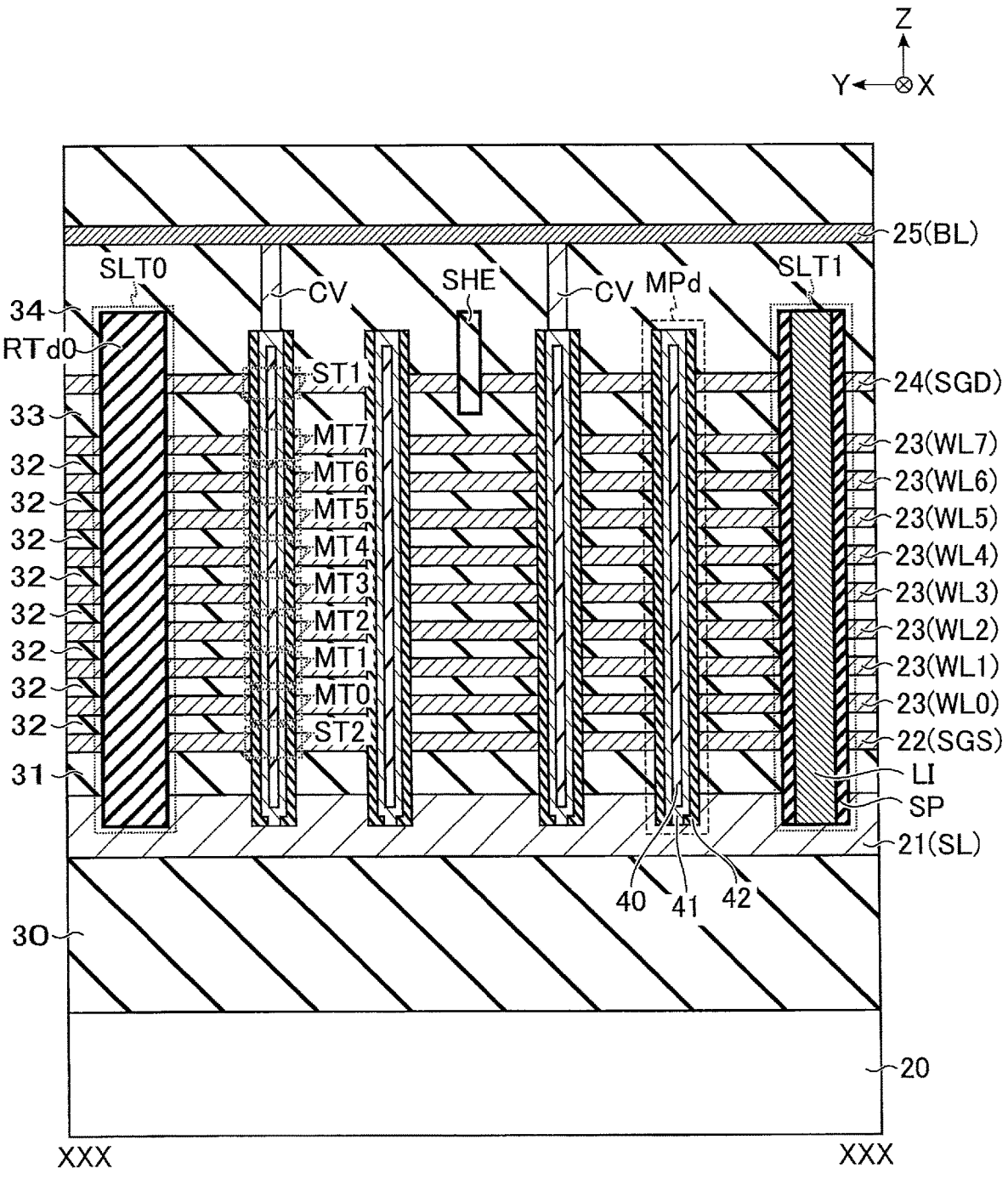
F I G. 30

SEMICONDUCTOR MEMORY DEVICE

CROSS-REFERENCE TO RELATED APPLICATIONS

This application is based upon and claims the benefit of priority from Japanese Patent Application No. 2021-148487, filed Sep. 13, 2021, the entire contents of which are incorporated herein by reference.

FIELD

Embodiments described herein relate generally to a semiconductor memory device.

BACKGROUND

A NAND flash memory capable of storing data in a non-volatile manner is known.

BRIEF DESCRIPTION OF THE DRAWINGS

FIG. 1 is a block diagram showing a configuration example of a semiconductor memory device 1 according to a first embodiment.

FIG. 2 is a circuit diagram showing an example of a circuit configuration of a memory cell array included in the semiconductor memory device 1 according to the first embodiment.

FIG. 3 is a plane diagram showing an example of a planar layout of the memory cell array included in the semiconductor memory device 1 according to the first embodiment.

FIG. 6 is a cross-sectional diagram taken along line VI-VI of FIG. 5, showing an example of a cross-sectional structure of a memory pillar MP in the semiconductor memory device 1 according to the first embodiment.

FIG. 7 shows an example of a planar layout of the memory cell array included in the semiconductor memory device 1 according to the first embodiment.

FIG. 8 is a flowchart showing an example of a method of manufacturing the semiconductor memory device 1 according to the first embodiment.

FIGS. 9 to 13 show examples of cross-sectional structures of the semiconductor memory device 1 during manufacturing according to the first embodiment.

FIG. 15 shows an example of a cross-sectional structure of the semiconductor memory device 1 during manufacturing according to the first embodiment.

FIGS. 19 to 20 show examples of cross-sectional structures of the semiconductor memory device 1 during manufacturing according to the first embodiment.

FIG. 22 shows an example of a planar layout of a memory cell array in a semiconductor memory device 1r according to a comparative example of the first embodiment.

FIG. 23 shows an example of a planar layout of the memory cell array included in the semiconductor memory device 1 according to the first embodiment.

FIG. 24 shows an example of a cross-sectional structure of the memory cell array in the semiconductor memory device 1 according to a modification of the first embodiment.

FIG. 26 shows an example of a cross-sectional structure of the memory cell array in the semiconductor memory device 1 according to a modification of the first embodiment.

FIG. 27 shows an example of a planar layout of a memory cell array included in a semiconductor memory device 1b according to a second embodiment.

FIG. 28 shows an example of a planar layout of a memory cell array included in a semiconductor memory device 1c according to a third embodiment.

FIG. 29 shows an example of a planar layout of a memory cell array included in a semiconductor memory device 1d according to a fourth embodiment.

FIG. 30 is a cross-sectional diagram taken along line XXX-XXX of FIG. 29, showing an example of a cross-sectional structure of the memory cell array included in the semiconductor memory device 1d according to the fourth embodiment.

DETAILED DESCRIPTION

Figure 4:
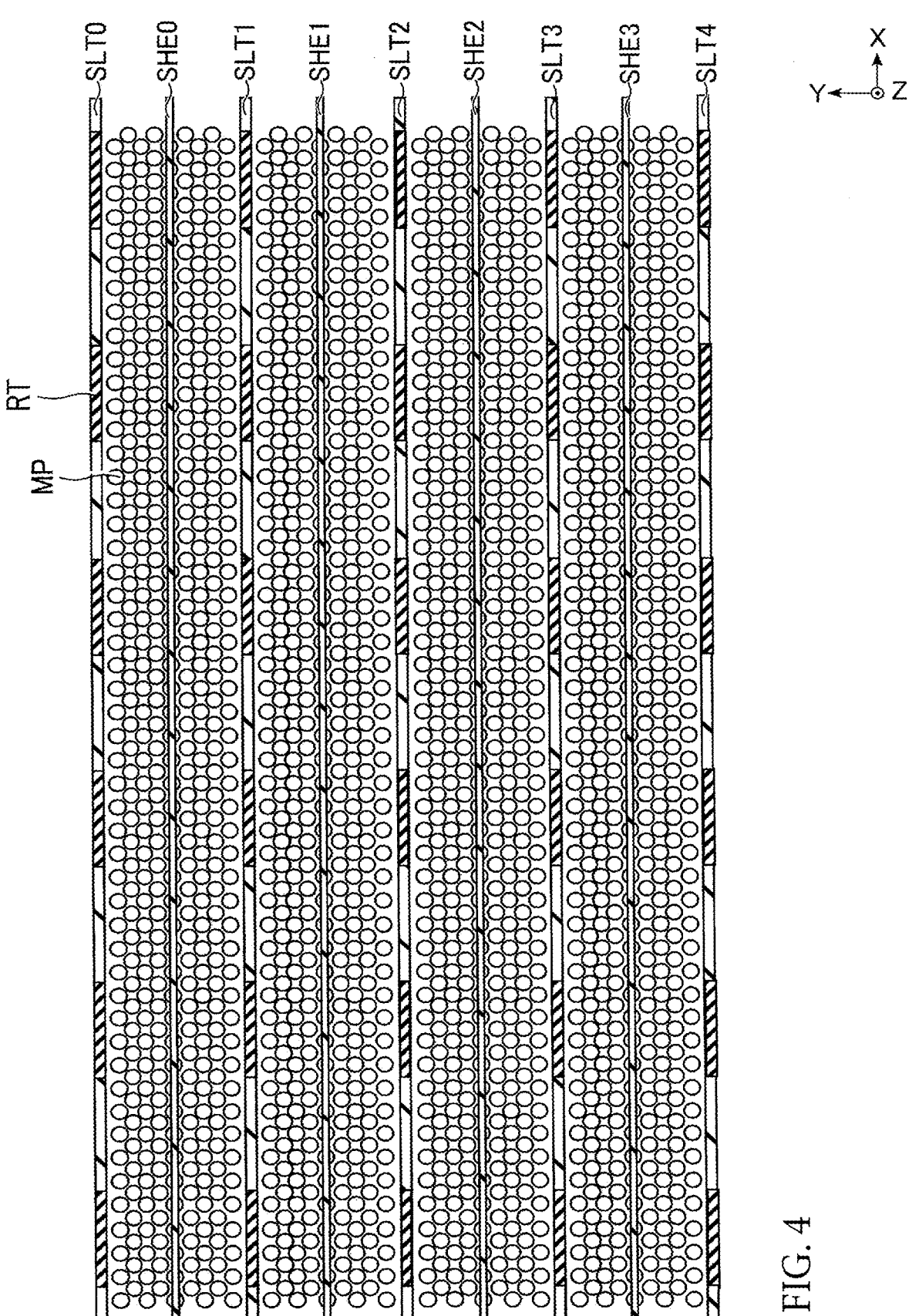
FIG. 4 is a plane diagram showing an example of a planar layout of the memory cell array included in the semiconductor memory device 1 according to the first embodiment.

A semiconductor memory device according to an embodiment includes a base layer, a first conductive layer, a first member, and a plurality of pillars. The base layer extends in a first plane that intersects a first direction. The first conductive layer is provided above the base layer in the first direction. The first member extends in a second direction above the base layer in the first direction, and divides the first conductive layer in a third direction that intersects the first direction and the second direction. The second direction intersects the first direction. The plurality of pillars penetrate the first conductive layer in the first direction, and form memory cells at intersections with the first conductive layer. The first member includes a first portion which is arranged locally on an upper end side and intermittently in the second direction. The plurality of pillars include a first pillar, a second pillar, a third pillar, a fourth pillar, a fifth pillar, and a sixth pillar. The second pillar is adjacent to the first pillar in the second direction on a side of the second direction of the first pillar. The third pillar faces a first region in the third direction. The first region is between the first pillar and the second pillar. The fourth pillar is adjacent to the third pillar in the second direction on a side of the second direction of the third pillar. The fifth pillar faces a second region in the third direction. The second region is between the third pillar and the fourth pillar. The sixth pillar is adjacent to the fifth pillar in the second direction on a side of the second direction of the fifth pillar. The first pillar and the second pillar face the first member. A first end of the first portion faces the first region. The first region, the second region, and a third region are positioned on an identical straight line. The third region is between the fifth pillar and the sixth pillar.

Hereinafter, embodiments will be described with reference to the drawings. Each embodiment illustrates a device and a method for embodying the technical idea of the embodiments. The drawings are either schematic or conceptual, and the dimensions, ratios, etc. of each drawing are not necessarily the same as the actual ones. The entire description of an embodiment is applicable as a description of another embodiment, unless otherwise expressly or implicitly excluded. The technical idea of the present embodiment is not designated by the shape, structure, arrangement, etc. of the components.

In the description that follows, components having an approximately identical function and configuration will be assigned an identical symbol. A numeral that follows letters constituting a reference symbol is used to distinguish between components referred to by reference symbols including the same letters and having a similar configuration. If components represented by reference symbols including the same letters need not be distinguished from each other, such components are referred to by reference symbols including only the same letters.

[1] First Embodiment

[1-1] Configuration (Structure)

Hereinafter, a description will be given of a semiconductor memory device 1 according to an embodiment.

[1-1-1] Configuration of Semiconductor Memory Device 1

FIG. 1 shows a configuration example of a semiconductor memory device 1 according to a first embodiment. The semiconductor memory device 1 is a NAND-type flash memory capable of storing data in a non-volatile manner. The semiconductor memory device 1 is controlled by an external memory controller 100.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer equal to or greater than 1). Each block BLK includes a set of memory cell transistors MT (not illustrated) capable of storing data in a non-volatile manner, and is used as, for example, a unit of data erasure. A plurality of source lines SL, a plurality of word lines WL, a plurality of bit lines BL, etc. (not illustrated) are coupled to the memory cell array 10. Each memory cell transistor MT is associated with, for example, a single bit line BL and a single word line WL. A detailed configuration of the memory cell array 10 will be described later.

The command register 11 holds a command CMD received by the semiconductor memory device 1 from the memory controller 100. The command CMD includes, for example, an order to cause the sequencer 13 to perform a read operation, a write operation, an erase operation, etc.

The address register 12 holds address information ADD received by the semiconductor memory device 1 from the memory controller 100. The address information ADD includes, for example, a block address BAd, a page address PAd, and a column address CAd. The block address BAd, the page address PAd, and the column address CAd are respectively used for selection of, for example, a block BLK, a word line WL, and a bit line BL.

The sequencer 13 controls the entire operation of the semiconductor memory device 1. For example, the sequencer 13 controls, based on the command CMD held in the command register 11, the driver module 14, the row decoder module 15, the sense amplifier module 16, etc., and performs a read operation, a write operation, an erase operation, etc.

The driver module 14 generates voltages used in a read operation, a write operation, an erase operation, etc., and supplies the generated voltages to the row decoder module 15. The driver module 14 applies the generated voltages to a signal line corresponding to the selected word line WL based on, for example, the page address PAd held in the address register 12.

The row decoder module 15 selects a single block BLK in the memory cell array 10 based on the block address BAd held in the address register 12. Subsequently, the row decoder module 15 transfers, to a selected word line WL in the selected block BLK, a voltage applied to a signal line coupled to the selected word line WL, for example.

In a write operation, the sense amplifier module 16 applies, to each bit line BL, a voltage that is determined according to write data DAT received from the memory controller 100. Also, in a read operation, the sense amplifier module 16 determines data stored in the memory cell transistor MT based on a voltage of the bit line BL, and transfers results of the determination to the memory controller 100 as read data DAT.

The semiconductor memory device 1 and the memory controller 100 described above may configure, in combination, a single semiconductor device. Examples of such a semiconductor device include a memory card such as an SD™ card and a solid-state drive (SSD).

[1-1-2] Circuit Configuration of Memory Cell Array 10

FIG. 2 is a circuit diagram showing an example of a circuit configuration of a memory cell array included in the semiconductor memory device according to the first embodiment. In FIG. 2, one of the blocks BLK included in the memory cell array 10 is extracted. All the other blocks BLK are configured of the components and couplings shown in FIG. 2. The number of blocks BLK in the memory cell array 10 and the number of string units SU in a single block BLK may be set to a desired number. In the description that follows, a case is assumed where a single block BLK includes two string units SU0 and SU1.

Each string unit SU is a set of NAND strings NS respectively associated with bit lines BL0 to BLm (where m is an integer equal to or greater than 1). Each NAND string NS includes a plurality of memory cell transistors MT, for example, memory cell transistors MT0 to MT7, and select transistors ST1 and ST2. In the description that follows, a case is assumed where each NAND string NS includes eight memory cell transistors MT0 to MT7.

Each memory cell transistor MT includes a control gate and a charge storage layer, and holds data in a non-volatile manner. Each of the select transistors ST1 and ST2 is used for selection of a string unit SU in various operations.

In each NAND string NS, the memory cell transistors MT0 to MT7 are coupled in series. A drain of the select transistor ST1 is coupled to a bit line BL associated therewith, and a source of the select transistor ST1 is coupled to one end of a group of the memory cell transistors MT0 to MT7. The other end of the group of the memory cell transistors MT0 to MT7 is coupled to a drain of a select transistor ST2. A source of the select transistor ST2 is coupled to a source line SL.

Control gates of the memory cell transistors MT0 to MT7 in the same block BLK are respectively coupled to the word lines WL0 to WL7. Gates of the select transistors ST1 in the string units SU0 to SU1 are respectively coupled to the select gate lines SGD0 to SGD1. Gates of the select transistors ST2 are coupled to a select gate line SGS.

Different column addresses are assigned to the bit lines BL0 to BLm. Each bit line BL is shared among a plurality of NAND strings NS to which the same column address is assigned in the blocks BLK. Each of the word lines WL0 to WL7 is provided for each block BLK. The source line SL is, for example, shared among a plurality of blocks BLK.

A set of memory cell transistors MT coupled to the common word line WL in each string unit SU is referred to as, for example, a "cell unit CU". The storage capacity of a cell unit CU including memory cell transistors MT that each stores 1-bit data is defined as, for example, "1-page data". The cell unit CU may have a storage capacity of two or more pages of data according to the number of bits of data stored in the memory cell transistor MT.

The circuit configuration of the memory cell array 10 included in the semiconductor memory device 1 according to the first embodiment is not limited to the above-described configuration. For example, the number of memory cell transistors MT and the select transistors ST1 and ST2 included in each NAND string NS may be set to a desired number.

[1-1-3] Planar Structure of Memory Cell Array 10

Hereinafter, an example of a structure of the memory cell array 10 included in the semiconductor memory device 1 according to the first embodiment will be described. In the description that follows, an orthogonal coordinate system including an X axis, a Y axis, and a Z axis will be used. In plane diagrams, hatching is suitably applied for improved visibility. The hatching applied in the plane diagrams does not necessarily relate to the material or characteristics of the hatched components. In the cross-sectional diagrams, components such as insulating layers (interlayer insulating films), interconnects, contacts, etc. are suitably omitted for improved visibility.

FIG. 3 is a plane diagram showing an example of a planar layout of the memory cell array 10 included in the semiconductor memory device 1 according to the first embodiment. In FIG. 3, a region including a single block BLK (i.e., string units SU0 and SU1) is extracted. As shown in FIG. 3, the memory cell array 10 includes a plurality of memory pillars MP, a plurality of contacts CV, a plurality of members SLT and SHE, and a plurality of bit lines BL.

The members SLT, each extending in the X direction, are arranged in the Y direction. Each member SLT includes a contact LI, a spacer SP, and a plurality of bridges RT. The contact LI is a conductor that extends over an XZ plane. The spacer SP is an insulator provided on a side surface of the contact LI. In other words, the contact LI is surrounded by the spacer SP in an XY planar view. Each member SLT splits stacked interconnects (to be described later) that are adjacent to each other with the member SLT interposed therebetween. In a single member SLT, a plurality of bridges RT are arranged locally on an upper end side in the Z direction and intermittently in the X direction. Details of the bridges RT will be described later.

The members SHE, each extending in the X direction, are arranged in the Y direction. In the present embodiment, a single member SHE is arranged between adjacent members SLT. Each member SHE includes, for example, a structure in which an insulator is buried. Each member SHE splits select gate lines SGD (to be described later) that are adjacent to each other with the member SHE interposed therebetween.

In the planar layout of the memory cell array 10 described above, a region divided by the member SLT functions as a single block BLK. Each region divided by the members SLT and SHE functions as a single string unit SU. Specifically, a member SHE is arranged, for example, between string units SU0 and SU1 that are adjacent to each other in the Y direction. In the memory cell array 10, a layout similar to the layout shown in FIG. 3, for example, is repeatedly arranged in the Y direction.

The planar layout of the memory cell array 10 included in the semiconductor memory device 1 according to the first embodiment is not limited to the layout described above. For example, the number of members SHE that are arranged between adjacent members SLT may be set to a desired number. The number of string units SU formed between adjacent members SLT may be varied based on the number of members SHE arranged between the adjacent members SLT.

The memory pillars MP extend in the Z direction, and penetrate through the stacked interconnects. The memory pillars MP include, for example, nine rows of memory pillars in a region between two members SLT that are adjacent to each other in an XY plane. In each row, the memory pillars MP are arranged in the X direction. A position of a memory pillar MP in one of two adjacent rows of memory pillars MP in the X direction and a position of a memory pillar MP in the other row in the X direction are shifted. In other words, memory pillars MP in two adjacent rows are arranged in a zig-zag pattern in the XY plane. For example, a single member SHE overlaps a memory pillar MP in the fifth row, counting from an upper side (+Y side) of the drawing. The number and arrangement of the memory pillars MP between adjacent members SLT are not limited thereto, and may be suitably varied. Each memory pillar MP functions as, for example, a single NAND string NS. The positional relationship between the memory pillars MP and the bridges RT will be described later.

The bit lines BL, each extending in the Y direction, are arranged in the X direction. Each bit line BL is arranged so as to overlap at least one memory pillar MP in each string unit SU. In the example of FIG. 3, a case is shown where two bit lines BL are arranged so as to overlap a single memory pillar MP. A contact CV is provided between a memory pillar MP and one of the bit lines BL that overlaps the memory pillar MP. Each memory pillar MP is electrically coupled to a single bit line BL with the contact CV interposed therebetween. In each region divided by the member SLT or the member SHE, a single contact CV is coupled to a single bit line BL.

For example, a contact CV between a bit line BL and a memory pillar MP that is in contact with the member SHE is omitted. In other words, a contact CV between a bit line BL and a memory pillar MP that is in contact with two different select gate. lines SGD is omitted. The number and arrangement of the memory pillars MP, the members SHE, etc. between adjacent members SLT are not limited to the configuration described with reference to FIG. 3, and may be suitably varied. The number of bit lines BL that overlap each memory pillar MP may be designed to be a desired number.

[1-1-4] Cross-sectional Structure of Memory Cell Array 10

FIG. 4 is a plane diagram showing an example of a planar layout of the memory cell array 10 included in the semiconductor memory device 1 according to the first embodiment. In FIG. 4, a region including the region shown in FIG. 3 is extracted to show a positional relationship of bridges RT in the memory cell array 10. As shown in FIG. 4, the memory cell array 10 includes a plurality of memory pillars MP and a plurality of members SLT and SHE. The members SLT are referred to as, from the +Y side in the Y direction, members "SLT0", "SLT1", "SLT2", "SLT3", and "SLT4". A member SHE between the members SLT0 and SLT1 is referred to as "SHE0". Similarly, a member SHE between the members SLT1 and SLT2, a member SHE between the members SLT2 and SLT3, and a member SHE between the members SLT3 and SLT4 are respectively referred to as "SHE1", "SHE2", and "SHE3".

As described above, in a single member SLT, plurality of bridges RT are arranged locally on an upper end side in the Z direction and intermittently in the X direction. That is, a plurality of bridges RT in a single member SLT are arranged in the X direction in the XY planar view.

Bridges RT in adjacent members SLT may either face or not face each other in the Y direction. The bridges RT in each member SLT may or may not be arranged at equal intervals in the X direction. The first embodiment and FIG. 4 are based on an example in which the bridges RT in each member SLT are arranged at equal intervals in the X direction. Examples in which the bridges RT are arranged at different intervals will be described in other embodiments.

Figure 5:
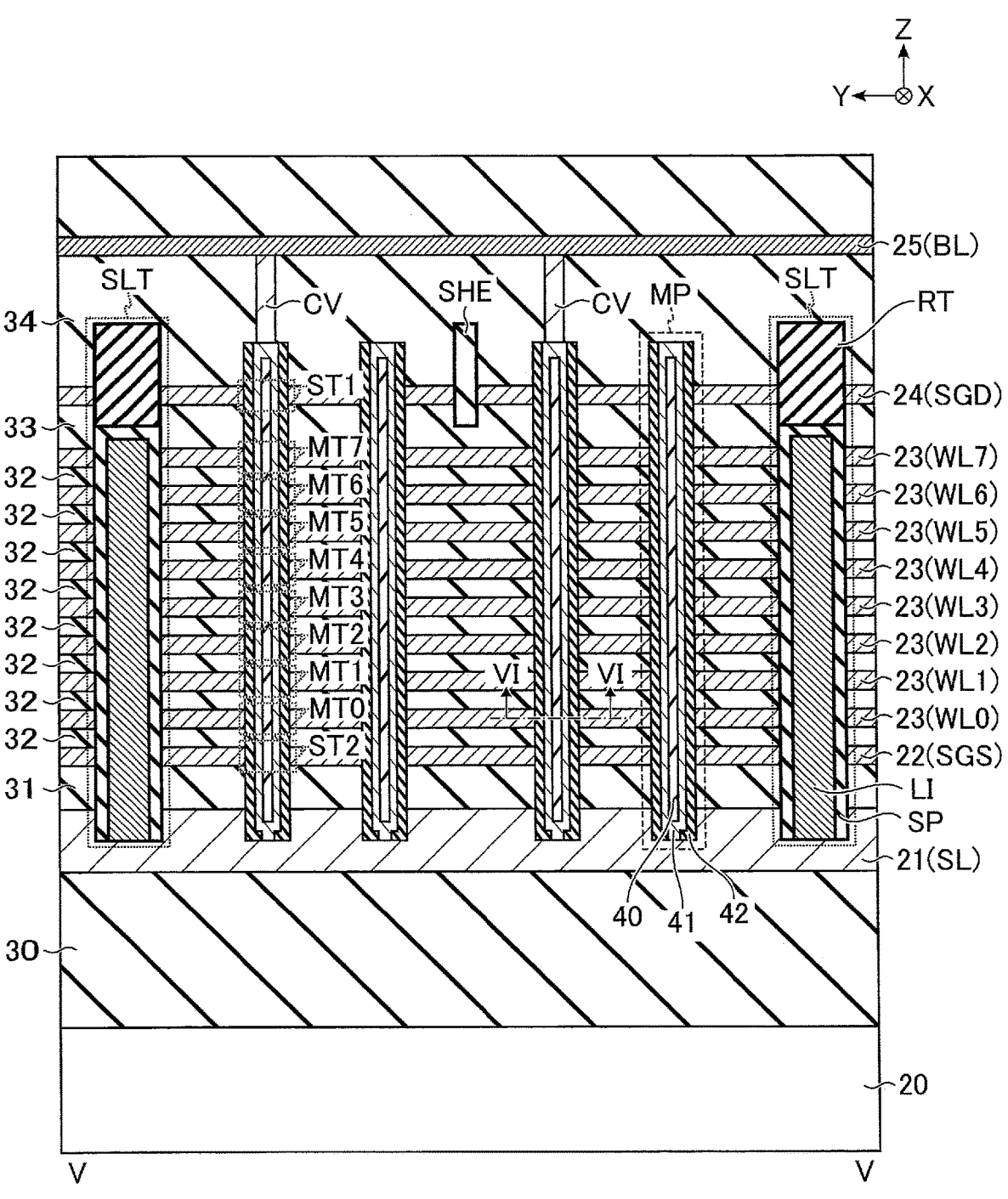
FIG. 5 is a cross-sectional diagram taken along line V-V of FIG. 3, showing an example of a cross-sectional structure of the memory cell array included in the semiconductor memory device 1 according to the first embodiment.

FIG. 5 is a cross-sectional diagram taken along line V-V of FIG. 3, showing an example of a cross-sectional structure of the memory cell array 10 included in the semiconductor memory device according to the first embodiment. As shown in FIG. 5, the memory cell array 10 further includes a semiconductor substrate 20, conductive layers 21 to 25, and insulating layers 30 to 34.

An insulating layer 30 is provided above a semiconductor substrate 20. The insulating layer 30 contains, for example, silicon oxide ($SiO_2$). A circuit region is provided in a part of the semiconductor substrate 20 and the insulating layer 30, and the memory cell array 10 is provided above the insulating layer 30, even though illustration of such a structure is omitted. In the circuit region, circuitry used for, for example, the row decoder module 15, the sense amplifier module 16, etc. is formed.

A conductive layer 21 is provided on the insulating layer 30. The conductive layer 21 is formed in, for example, a plate shape extending along the XY plane, and is used as a source line SL. The conductive layer 21 is, for example, an N-type semiconductor. The conductive layer 21 contains, for example, a metallic material or silicon (Si) doped with phosphorous (P).

Such a lower-layer structure is used as a base layer, and stacked interconnects of the memory cell array 10 are formed thereabove. That is, an insulating layer 31 is provided on the conductive layer 21. A conductive layer 22 is provided on the insulating layer 31. The conductive layer 22 is formed in, for example, a plate shape extending along the XY plane. The conductive layer 22 is used as a select gate line SGS. The conductive layer 22 contains, for example, tungsten (W) or molybdenum (Mo).

Insulating layers 32 and conductive layers 23 are stacked in an alternating manner above the conductive layer 22. Each conductive layer 23 is formed in, for example, a plate shape extending along the XY plane. The stacked conductive layers 23 are respectively used as word lines WL0 to WL7, from the side of the semiconductor substrate 20. The conductive layers 23 contain, for example, tungsten or molybdenum.

An insulating layer 33 is provided above the topmost conductive layer 23. A conductive layer 24 is provided on the insulating layer 33. The conductive layer 24 is formed in, for example, a plate shape extending along the XY plane, and is used as a select gate line SGD. The conductive layer 24 contains, for example, tungsten or molybdenum.

An insulating layer 34 is provided on the conductive layer 24. Conductive layers 25 are provided on the insulating layer 34. Each conductive layer 25 is formed, for example, in a line shape extending in the Y direction, and is used as a bit line EL. The conductive layers 25 are arranged in the X direction in an unillustrated region. The conductive layers 25 contain, for example, copper (Cu).

A plurality of memory pillars MP extend in the Z direction, each penetrating through the insulating layers 31 to 33 and the conductive layers 22 to 24. Upper ends of the memory pillars MP are included in the insulating layer 34. Lower ends of the memory pillars MP are included in the conductive layer 21.

Each of the memory pillars MP includes, for example, a core member 40, a semiconductor layer 41, and a laminated film 42. The core member 40 extends in the Z direction, and is provided in a central part of the memory pillar MP. For example, an upper end of the core member 40 is included in a layer above a layer in which the conductive layers 24 are provided. A lower end of the core member 40 reaches the conductive layer 21. The core member 40 includes, for example, an insulator such as silicon oxide.

The semiconductor layer 41 covers, for example, the periphery of the core member 40. A bottom surface of the semiconductor layer 41 is in contact with, for example, the conductive layer 21. The semiconductor layer 41 contains, for example, silicon.

The laminated film 42 covers a side surface and a bottom surface of the semiconductor layer 41, except for a portion at which the semiconductor layer 41 and the conductive layer 21 are in contact with each other. Details of the laminated film 42 will be described with reference to FIG. 6.

In the structure of the memory pillar MP described above, a portion at which the memory pillar MP and the conductive layer 22 intersect functions as a select transistor ST2. The portion at which the memory pillar MP and each conductive layer 23 intersect functions as a single memory cell transistor MT. The portion at which the memory pillar MP and the conductive layer 24 intersect functions as a select transistor ST1.

The member SLT extends in the XZ plane, and divides the conductive layers 22 to 24 in the Y direction. An upper end of the member SLT is in contact with the insulating layer 34. The contact LI in the member SLT is provided along the member SLT. A portion of an upper end of the contact LI that is not shown in FIG. 5 is in contact with the insulating layer 34. A lower end of the contact LI is in contact with the conductive layer 21. The contact LI is used as, for example, a portion of the source line SL. The spacer SP is provided at least between the contact LI and the conductive layers 22 to 24. A region between the contact LI and the conductive layers 22 to 24 is isolated and insulated by the spacer SP. The spacer SP may be provided between the contact LI and the bridge RT.

A portion of an upper portion of the member SLT includes a plurality of bridges RT. The bridges RT in each member SLT are arranged locally on an upper end side in the Z direction and intermittently in the X direction. An upper end of the bridge RT is in contact with the insulating layer 34. A lower end of the bridge RT is in contact with, for example, the insulating layer 33. A lower end of the bridge RT may be included in a layer below the insulating layer 33. The bridge RT includes, for example, an insulator such as silicon oxide.

The member SHE is, for example, provided in the XZ plane, and divides at least the conductive layer 24 in the Y direction. An upper end of the member SHE is in contact with the insulating layer 34. A lower end of the member SHE is in contact with the insulating layer 33. The member SHE includes, for example, an insulator such as silicon oxide. An upper end of the member SHE and an upper end of the member SLT may be either aligned or not aligned. An upper end of the member SHE and an upper end of the memory pillar MP may be either aligned or not aligned.

A pillar-shaped contact CV is provided on an upper surface of the semiconductor layer 41 in the memory pillar MP. In an illustrated region, contacts CV coupled to two of the four memory pillars MP are shown. In an unillustrated region, contacts CV are coupled to the memory pillars MP which do not overlap the member SHE and to which contacts CV are not coupled in the illustrated region.

A single conductive layer 25, namely, a single bit line EL, is in contact with an upper surface of each contact CV. Each contact CV is coupled to a single conductive layer 25 in each of the spaces divided by the members SLT and SHE. That is, a memory pillar MP provided between adjacent members SLT and SHE and a memory pillar MP provided between two adjacent members SHE are electrically coupled to each of the conductive layers 25.

FIG. 6 is a cross-sectional diagram taken along line VI-VI of FIG. 5, showing an example of a cross-sectional structure of a memory pillar MP in the semiconductor memory device 1 according to the first embodiment. More specifically, FIG. 6 shows a cross-sectional structure of a memory pillar MP in a layer that is parallel to a surface of the semiconductor substrate 20 and that includes the conductive layer 23. As shown in FIG. 6, the laminated film 42 includes, for example, a tunnel insulating film 43, an insulating film 44, and a block insulating film 45.

In a cross section including the conductive layer 23, the core member 40 is provided in a central part of the memory pillar MP. The semiconductor layer 41 surrounds a side surface of the core member 40. The tunnel insulating film 43 surrounds a side surface of the semiconductor layer 41. The insulating film 44 surrounds a side surface of the tunnel insulating film 43. The block insulating film 45 surrounds a side surface of the insulating film 44. The conductive layer 23 surrounds a side surface of the block insulating film 45. Each of the tunnel insulating film 43 and the block insulating film 45 contains, for example, silicon oxide. The insulating film 44 contains, for example, silicon nitride.

In each memory pillar MP described above, the semiconductor layer 41 is used as a channel (current path) of each of the memory cell transistors MT0 to MT7 and the select transistors ST1 and ST2. The insulating film 44 is used as a charge storage layer of the memory cell transistor MT. The semiconductor memory device 1 turns on the memory cell transistors MT0 to MT7 and the select transistors ST1 and ST2, to let a current flow between the bit line BL and the contact LI via the memory pillar MP. Thereby, each of the memory pillars MP is capable of functioning as a single NAND string NS.

FIG. 7 shows an example of a planar layout of the memory cell array 10 in the semiconductor memory device 1 according to the first embodiment. FIG. 7 shows a cross section in a layer including the conductive layer 23 in a region including the members SLT0, SLT1, and SLT2 in FIG. 4. In FIG. 7, members SHE are omitted.

The bridges RT included in the member SLT0, the member SLT1, and the member SLT2 may be respectively referred to as bridges "RT0", "RT1", and "RT2". Similarly, the reference numerals of bridges RT included in a member SLTn (where n is an integer equal to or greater than 1) may have an n added at the end. Ends of a bridge RT may be distinguished in such a manner that a −X side end is referred to as a "bridge end RTA", and a +X side end is referred to as a "bridge end RTB".

A region interposed between the member SLT0 and the member SLT1 may be referred to as a "region MA01". A region interposed between the member SLT1 and the member SLT2 may be referred to as a "region MA12".

A reference numeral of a component in a region interposed between the member SLT0 and the member SLT1 may have a "01" added at the end. For example, a memory pillar MP included in the region MA01 may be referred to as a "memory pillar MP01". Similarly, a region interposed between the member SLTn and the member SLTm (m=n+1) may be referred to as a "region MAnm". A reference numeral of a component in a region interposed between the member SLTn and the member SLTm may have an "nm" added at the end. For example, a memory pillar MP included in a region MAnm may be referred to as a "memory pillar MPnm".

In the region MA01, nine rows of memory pillars MP01 may be respectively referred to as, from the memory pillar MP01 in a row closest to the member SLT0, memory pillars MP01-1, MP01-2, MP01-3, MP01-4, MP01-5, MP01-6, MP01-7, MP01-8, and MP01-9.

Similarly, in a region MA, nine rows of memory pillars MP may be respectively referred to as, from the memory pillar MP in a row closest to the +Y side member SLT, memory pillars "MP-1", "MP-2", "MP-3", "MP-4", "MP-5", "MP-6", "MP-7", "MP-8", and "MP-9".

A configuration of the region MA01 and the member SLT0 will be described. As described above, in the semiconductor memory device 1 according to the first embodiment, the memory pillars MP include nine rows of memory pillars in a region between two members SLT that are adjacent to each other in an XY plane. In each row, the memory pillars MP are arranged in the X direction. A position of a memory pillar MP in one of two adjacent rows of memory pillars MP in the X direction and a position of a memory pillar MP in the other row in the X direction are shifted. In other words, memory pillars MP in two adjacent rows are arranged in a zig-zag pattern in the XY plane.

In the member SLT0, the bridge end RT0A and/or RT0B does not face the memory pillars MP01-1. That is, the bridge end RT0A and/or RT0B faces a portion between a memory pillar MP01-1 and a memory pillar MP01-1 that are adjacent to each other in the X direction. In other words, at least one of the bridge ends RT0A and RT0B is provided to not face the memory pillars MP01-1.

Next, a configuration of the region MA12 and the members SLT1 and SLT2 will be described. The memory pillars MP12 in the region MA12 are arranged so as to be approximately line-symmetric to the region MA01 about the member SLT1. In other words, the memory pillars MP12 are arranged so as to be approximately line-symmetric to the memory pillars MP01 with respect to the member SLT1. The substantial line symmetry includes errors caused in manufacturing.

Similarly, the layout of the memory pillars MP23 in the region. MA23 is provided so as to be approximately line-symmetric to that in the region MA12 about the member SLT2 (not illustrated). In this manner, in the semiconductor memory device 1, memory pillars MP in regions MA that are adjacent to each other with a member SLT interposed therebetween are arranged so as to be approximately line-symmetric to each other with respect to the member SLT. Specifically, memory pillars MPnm and memory pillars MPml in a region MAnm and a region MAml (l=m+1), which are adjacent to each other with a member SLTm interposed therebetween, are arranged so as to be approximately line-symmetric to each other with respect to the member SLTm.

The bridge RT1 of the member SLT1 may face or not face the bridge RT0 in the Y direction. In the member SLT1, the bridge end RT1A and/or RT1B does not face the memory pillars MP12-1. That is, the bridge end RT1A and/or RT1B faces a portion between a memory pillar MP12-1 and a memory pillar MP12-1 that are adjacent to each other in the X direction. In other words, at least one of the bridge ends RT1A and RT1B is provided to not face the memory pillars MP12-1.

At this time, as described above, the memory pillars MP01 and the memory pillars MP12 are arranged so as to be approximately line-symmetric to each other with respect to the member SLT1. Thus, the bridge end RT1A and/or RT1B does not face the memory pillars MP01-9. That is, the bridge end RT1A and/or RT1B faces a portion between a memory pillar MP01-9 and a memory pillar MP01-9 that are adjacent to each other in the X direction. In other words, at least one of the bridge ends RT1A and RT1B is provided to not face the memory pillars MP01-9.

Similarly, the bridge RT2 of the member SLT2 may face or not face the bridges RT0 and RT1 in the Y direction. In the member SLT2, the bridge end RT2A and/or RT2B does not face the memory pillars MP12-9. That is, the bridge end RT2A and/or RT2B faces a portion between a memory pillar MP12-9 and a memory pillar MP12-9 that are adjacent to each other in the X direction. In other words, at least one of the bridge ends RT2A and RT2B is provided to not face the memory pillars MP12-9.

Similarly, in an unillustrated region, a bridge end RTmA and/or RTmB in a member SLTm does not face memory pillars MPml-1 and MPnm-9 that are adjacent to the member SLTm. That is, the bridge end RTmA and/or RTmB faces a portion between a memory pillar MPml-1 and a memory pillar MPml-1 that are adjacent to each other. Also, the bridge end RTmA and/or RTmB faces a portion between a memory pillar MPnm-9 and a memory pillar MPnm-9 that are adjacent to each other. In other words, at least one of the bridge ends RTmA and RTmB is provided to not face memory pillars MPml-1 and MPnm-9 that are adjacent to the member SLTm.

[1-2] Method of Manufacturing Semiconductor Memory Device 1

Hereinafter, an example of a series of manufacturing steps related to formation of a structure of stacked interconnects of the memory cell array 10 in the semiconductor memory device 1 according to the first embodiment will be described with reference to FIG. 8. FIG. 8 is a flowchart showing an example of a method of manufacturing the semiconductor memory device 1 according to the first embodiment. Each of FIGS. 9 to 21 shows an example of a cross-sectional structure of the semiconductor memory device 1 during manufacturing according to the first embodiment. FIGS. 9 to 13, 15, 17, 19 and 20 show cross sections of a region identical to that of FIG. 5.

First, as shown in FIG. 9, sacrificial members 60 to 62 are stacked on a base layer (step S101). The sacrificial members 60 to 62 are formed in a region in which conductive layers 22 to 24, which respectively function as a select gate line SGS, a word line WL, and a select gate line SGD, are to be formed. Specifically, on a semiconductor substrate 20, an insulating layer 30, a conductive layer 21, an insulating layer 31, and a sacrificial member 60 are sequentially stacked.

Thereafter, insulating layers 32 and sacrificial members 61 are stacked in an alternating manner on the sacrificial member 60, and an insulating layer 33 is formed on the topmost sacrificial member 61. A sacrificial member 62 is formed on the insulating layer 33. An insulating layer 34a is formed on the sacrificial member 62. The number of layers in which the sacrificial members 61 are formed is, for example, equal to the number of word lines WL.

The insulating layers 30 to 34a contain, for example, silicon oxide. The sacrificial members 60 to 62 contain, for example, silicon nitride.

Thereafter, as shown in FIG. 10, memory pillars MP are formed (step S102). Specifically, a mask is formed by photolithography, etc. with openings in regions in which memory pillars MP are to be formed. Subsequently, memory holes are formed by anisotropic etching using the formed mask. The anisotropic etching in this process is, for example, reactive ion etching (RIE). Each memory hole penetrates the insulating layers 31 to 34a and the sacrificial members 60 to 62, and a bottom portion of the memory hole reaches, for example, the conductive layer 21. Thereafter, a laminated film 42 is formed on a side surface and a bottom surface of the memory hole, and thereby a block insulating film 45, an insulating film 44, and a tunnel insulating film 43 are sequentially formed. After that, part of the block insulating film 45, the insulating film 44, and the tunnel insulating film 43 at the bottom portion of the memory hole is removed. After that, a semiconductor layer 41 is formed on a surface of the tunnel insulating film 43 in the memory hole. The semiconductor layer 41 is in contact with the conductive layer 21. Furthermore, a core member 40 is formed, and the core member 40 is buried into the memory hole. Thereby, a memory pillar MP is formed.

Thereafter, an insulating layer 34b is formed on upper surfaces of the insulating layer 34a and the memory pillars MP. Hereinafter, a layer formed of the insulating layer 34a and the insulating layer 34b may be referred to as an "insulating layer 34".

Figure 11:
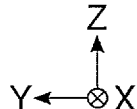

Thereafter, as shown in FIG. 11, slits SHH0 and SHH1 are formed (step S103). The slits SHH0 and SHH1 are respectively formed in regions in which the members SLT0 and SLT1 are to be formed. Specifically, a mask is formed by photolithography, etc. with openings in regions corresponding to slits SHH0 and SHH1, and the slits SHH0 and SHH1 are formed by anisotropic etching using the mask. The slits SHH0 and SHH1 split the insulating layers 31 to 34 and the sacrificial members 60 to 62.

Thereafter, as shown in FIG. 12, sacrificial members 650 and 651 are formed (step S104). Specifically, sacrificial members 650 and 651 are respectively formed so as to fill in the slits SHH0 and SHH1 formed at step S103.

It suffices that the sacrificial members 650 and 651 reach at least an upper surface of the insulating layer 34, and they may be formed beyond an upper surface of the insulating layer 34. The sacrificial members 650 and 651 contain, for example, amorphous silicon.

Figure 14:
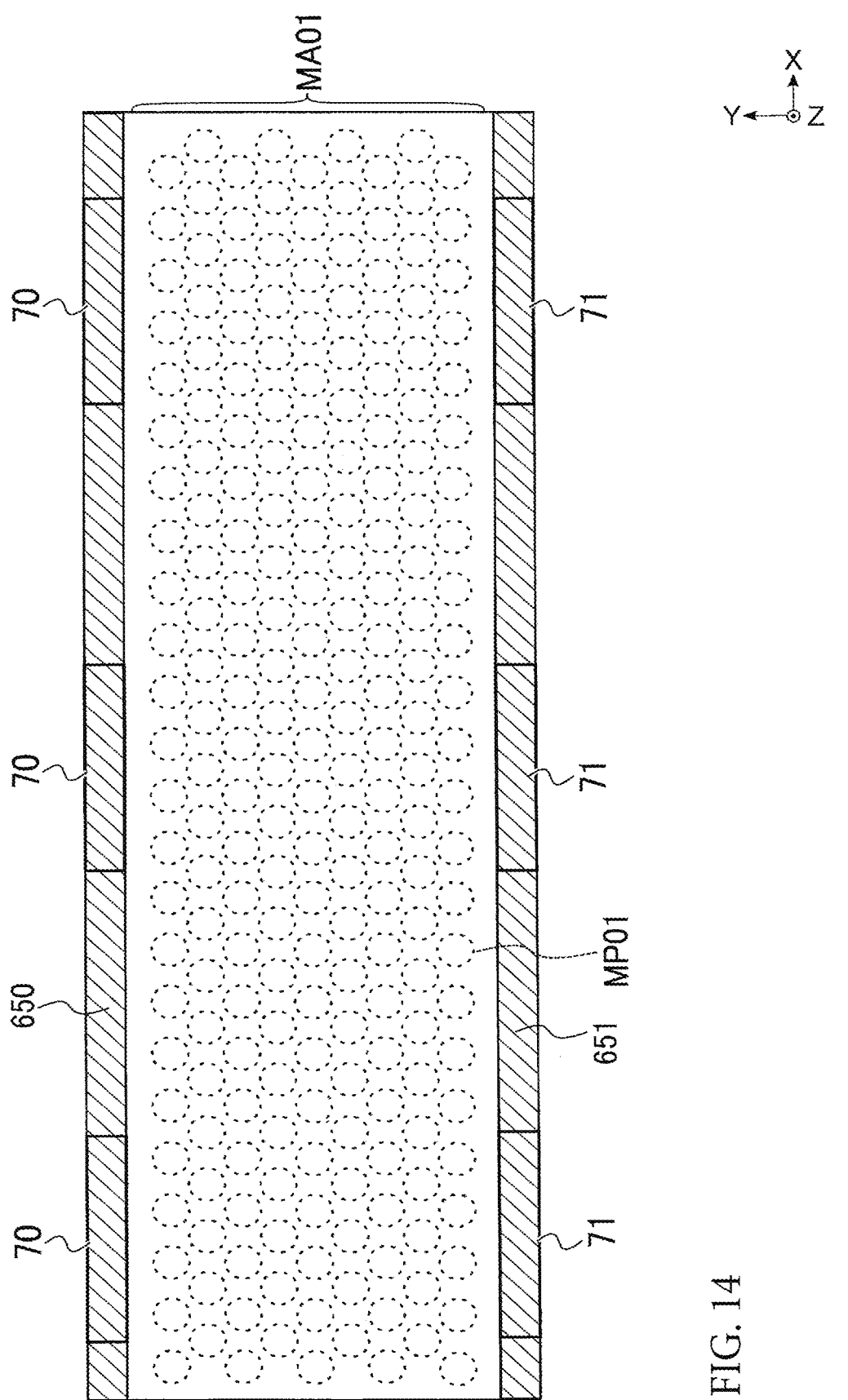
FIG. 14 shows an example of a planar structure of the semiconductor memory device 1 during manufacturing according to the first embodiment.

Thereafter, as shown in FIGS. 13 and 14, part of the sacrificial members 650 and 651 is etched (step S105). FIG. 14 is an XY plane diagram in which the structure of FIG. 13 is viewed from a +Z side in the Z direction. Part of the sacrificial members 650 and 651 formed at step S104 is selectively removed. Thereby, spaces 70 and 71 are respectively formed in regions in which the bridges RT0 and RT1 are to be formed. Specifically, in a region in which members SLT0 are to be formed, the spaces 70 are arranged locally on an upper end side in the Z direction and intermittently in the X direction. That is, in the XY planar view, the spaces 70 are arranged in the X direction in regions in which the bridges RT0 are to be formed. Similarly, in regions in which members SLT1 are to be formed, the spaces 71 are arranged locally on an upper end side in the Z direction and intermittently in the X direction. That is, in the XY planar view, the spaces 71 are arranged in the X direction in a region in which the bridges RT1 are to be formed.

Figure 16:
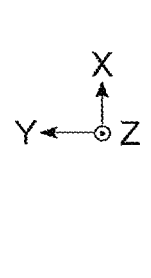
FIG. 16 shows an example of a planar structure of the semiconductor memory device 1 during manufacturing according to the first embodiment.

Thereafter, as shown in FIGS. 15 and 16, bridges RT0 and RT1 are formed (step S106). FIG. 16 is an XY plane diagram in which the structure of FIG. 15 is viewed from a +Z side in the Z direction. The bridges RT0 and RT1 are formed so as to fill in the spaces 70 and 71 formed at step S105. Thereafter, an insulating member formed at an upper portion of the insulating layer 34 is removed.

Since the spaces 70 and 71 are formed after the slits SHH0 and SHH1 are formed, there is a case where the spaces 70 and 71 are formed to have a larger width in the XY planar view than the slits SHH0 and SHH1. In other words, the bridges RT may be formed to have a larger width in the XY planar view than a portion of the member SLT other than the bridges RT. Details will be described later in modifications of the first embodiment.

Figure 17:
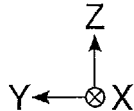
FIG. 17 shows an example of a cross-sectional structure of the semiconductor memory device 1 during manufacturing according to the first embodiment.
Figure 18:
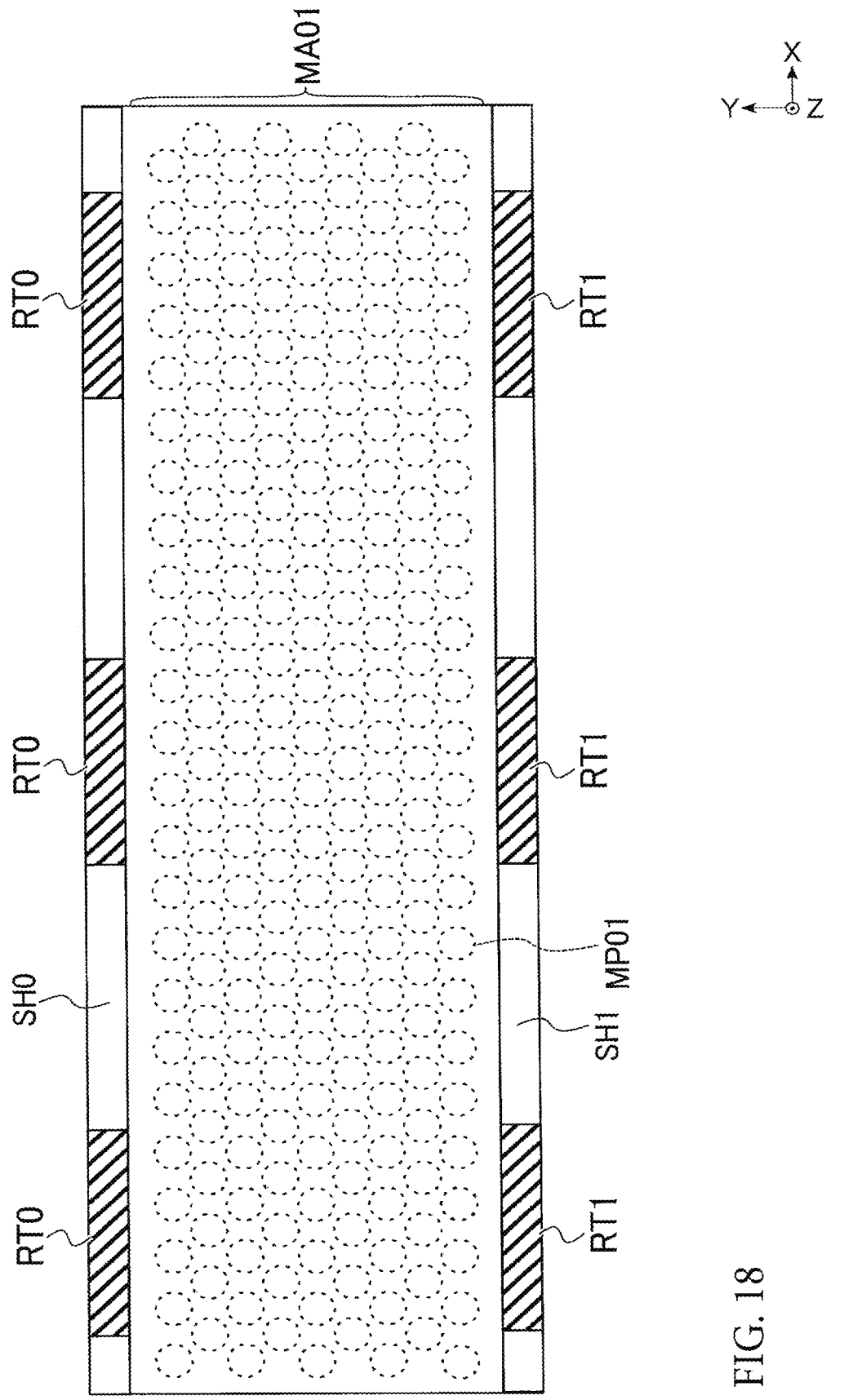
FIG. 18 shows an example of a planar structure of the semiconductor memory device 1 during manufacturing according to the first embodiment.

Thereafter, as shown in FIGS. 17 and 18, the sacrificial members 650 and 651 are removed (step S107). FIG. 18 is an XY plane diagram in which the structure of FIG. 17 is viewed from a +Z side in the Z direction. The sacrificial members 650 and 651 are selectively removed by, for example, wet etching from an upper surface of the stack structure. At this time, the bridges RT0 and RT1 are held without being etched. The spaces generated by the removal of the sacrificial members 650 and 651 may be hereinafter respectively referred to as slits "SH0" and "SH1". The sacrificial members 650 and 651 below the bridges RT0 and RT1 are etched in such a manner that a chemical detours therearound in the X direction in the slit SH.

Thereafter, as shown in FIG. 19, the sacrificial members 60 to 62 are removed (step S108). Specifically, the sacrificial members 60 to 62 are selectively removed through the slit SH by, for example, wet etching using thermal phosphoric acid. At this time, since the bridges RT0 and RT1 are held without being etched, part of a side surface of the sacrificial member 62 is occluded by the bridges RT. In other words, part of the side surface of the sacrificial member 62 is in contact with the bridge RT. The portion of the sacrificial member 62 that is in contact with the bridge RT is etched in such a manner that a chemical detours therearound from the slit SH. Correspondingly, the portion of the sacrificial member 62 that is in contact with the bridge RT, around which a chemical detours, takes a longer time to be etched than a portion of the sacrificial member 62 facing the slit SH. Details of the etching will be described later.

Thereby, a space is formed in a region in which the conductive layers 22 to 24 are to be formed. A three-dimensional structure of the architecture from which sacrificial members 60 to 62 have been removed is maintained by a plurality of memory pillars MP.

Figure 21:
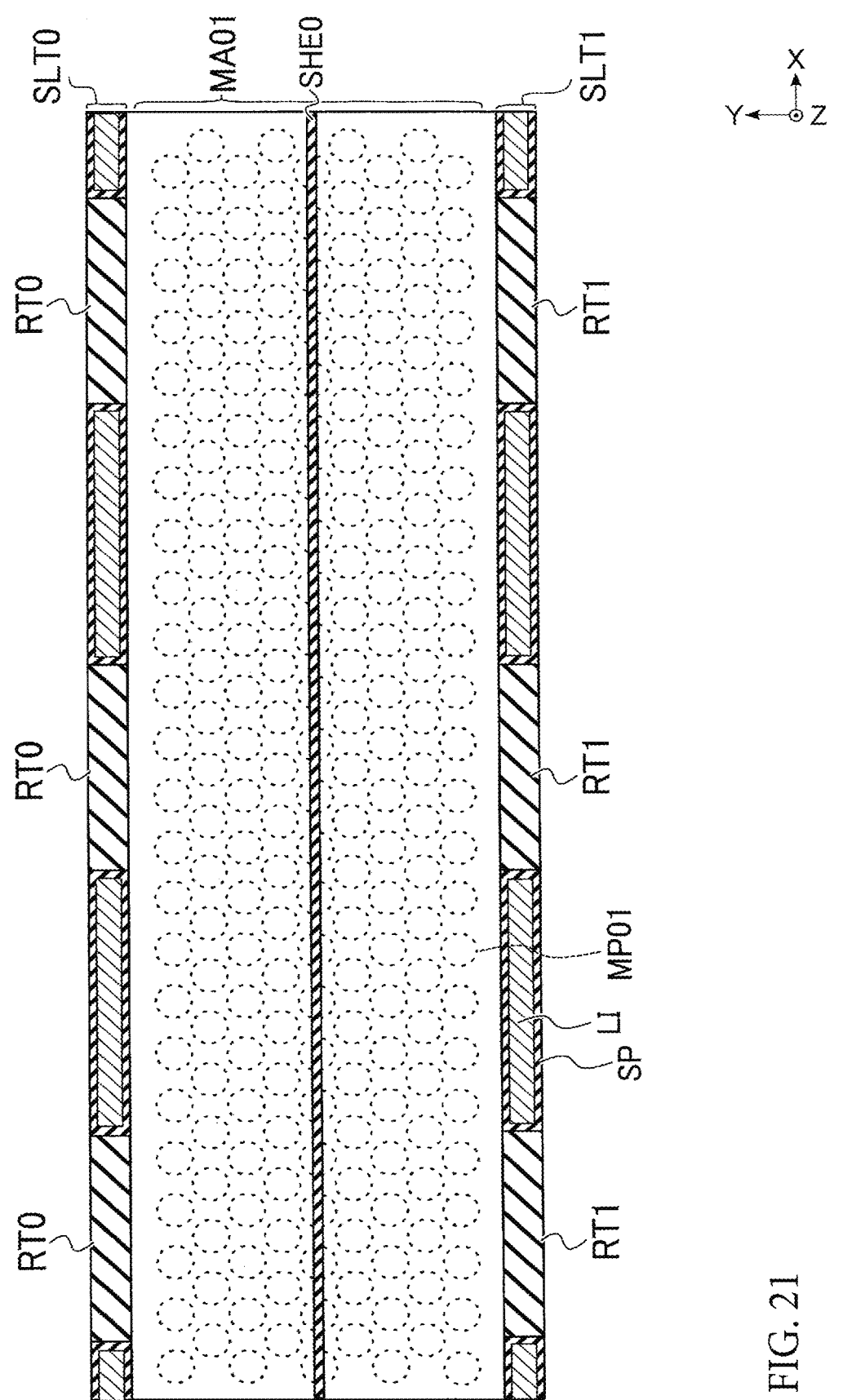
FIG. 21 shows an example of a planar structure of the semiconductor memory device 1 during manufacturing according to the first embodiment.

Thereafter, as shown in FIGS. 20 and 21, stacked interconnect structures, members SHE, and members SLT are formed (step S109). FIG. 21 is an XY-plane diagram showing the structure of FIG. 20 from the +Z side in the Z direction. A conductor is buried into the space from which the sacrificial members 60 to 62 have been removed through the slits SH. After that, the conductor formed in the slits SH is removed by an etchback process. Thereby, a conductive layer 22 which functions as a select gate line SGS, conductive layers 23 which function as word lines WL0 to WL7, and a conductive layer 24 which functions as a select gate line SGD are formed.

The conductive layers 22 to 24 formed at this step may be obtained by forming a high-dielectric film containing a metal oxide over a space in which the conductive layers 22-24 are to be formed and then burying a conductor therein. In such a conductor, a barrier metal such as titanium nitride may be arranged in the periphery of a metallic film of tungsten, etc. In this case, in formation of a conductor after removal of the sacrificial members 60 to 62, titanium nitride is deposited as a barrier metal after, for example, aluminum oxide is formed as a high dielectric film, and then tungsten is formed.

In this manner, since the conductive layers 22 to 24 are formed after the bridges RT are formed, a metallic oxide that forms a high dielectric film and/or a metallic material contained in the conductive layers 22 to 24 may not be completely removed and may remain between a bridge RT and a portion of the member SLT other than the bridges RT, in particular, on a lower surface side of the bridges RT. Details will be described later in modifications of the first embodiment.

Thereafter, a member SLT is formed in each slit SH. Specifically, an insulating portion (spacer SP) that covers side surfaces and bottom surfaces of the slits SH and the bridges RT is formed. Subsequently, part of the spacer SP provided in a bottom portion of the slit SH is removed, letting part of the conductive layer 21 be exposed at the bottom portion of the slit SH. Thereafter, a conductor (contact LI) is formed in the slit SH. The conductor formed outside the slit SH is removed by, for example, CMP. Also, a member SHE that further divides the conductive layer 24 of the stacked interconnect structure into a plurality of portions is formed.

Thereafter, the insulating layer 34 on the memory pillar MP is removed, and a contact CV is provided on the memory pillar MP. Thereafter, the conductive layer 25 that functions as a bit line BL is formed on the contact CV.

Through the manufacturing process of the semiconductor memory device 1 according to the first embodiment described above, a stacked interconnect structure in the memory cell array 10 is formed. The above-described manufacturing process is merely an example, and is not limited thereto. For example, another process may be inserted between the manufacturing steps, and some of the steps may be omitted or integrated. Also, the order of the manufacturing steps may be switched as long as a problem will not occur.

[1-3] Advantageous Effects of First Embodiment

With the semiconductor memory device 1 according to the first embodiment described above, it is possible to suppress deterioration of electronic characteristics of the memory cell transistors, thus providing the semiconductor memory device 1 with high quality. Hereinafter, detailed effects of the semiconductor memory device 1 according to the first embodiment will be described.

As described with reference to FIG. 19, the stacked interconnects of the semiconductor memory device 1 are formed by etching the sacrificial members 60 to 62 and respectively replacing them with the conductive layers 22 to 24. As described above, the sacrificial members 60 to 62 contain, for example, silicon nitride, and the conductive layers 22 to 24 contain tungsten. The stacked interconnect structure may include, on side surfaces of the conductive layers 22 to 24 of tungsten, etc., a high dielectric film containing, for example, aluminum oxide. When the aluminum oxide is formed in a space from which the silicon nitride has been removed and a thermal process is performed in a subsequent step, there may be a case where the aluminum oxide contracts. With the contraction of the aluminum oxide, a stress is applied to the stack structure. The generated stress may cause deformation in the stack structure into which tungsten has not yet been filled. Deformation of the stack structure includes, for example, tilting the stack structure portion and narrowing an upper portion of the slit SH.

When the upper portion of the slit SH is narrowed, a raw material gas containing tungsten cannot be sufficiently supplied in the subsequent step to a region in which the conductive layers 22 to 24 are to be formed, causing a possible failure of formation of the conductive layers 22 to 24.

Hereinafter, a semiconductor memory device 1 according to a comparative example of the first embodiment will be described with reference to FIG. 22. The semiconductor memory device 1 according to the comparative example of the first embodiment may be referred to as a "semiconductor memory device 1r" for distinction from the semiconductor memory device 1 of the first embodiment. FIG. 22 shows an example of a planar layout of a memory cell array 10 in the semiconductor memory device 1r according to the comparative example of the first embodiment. FIG. 22 shows a cross section in the same layer in the same region as that of FIG. 7. The semiconductor memory device 1r according to a comparative example of the first embodiment includes bridges RTX in part of the member SLT, and the slits SH are prevented from being narrowed by the formation of the bridges RTX in the member SLT. The semiconductor memory device 1r differs from the semiconductor memory device 1 (FIG. 7) according to the first embodiment mainly in terms of the positional relationship between the bridges RTX and the memory pillars MP.

In the semiconductor memory device 1r according to the comparative example, the positions of the bridges RTX are determined without taking into account the relative relationship with the positions of the memory pillars MP. Thus, the semiconductor memory device 1r may take, for example, the structure shown in FIG. 22 in the arrangement of the bridges RTX and the memory pillars MP.

As shown in FIG. 22, bridge ends RTXmA and RTXmB in a member SLTm of the semiconductor memory device 1r face memory pillars MPml-1 and MPnm-9 that are adjacent to the member SLTm. That is, the bridge ends RTXmA and RTXmB do not face a portion between a memory pillar MPml-1 and a memory pillar MPml-1 that are adjacent to each other. Also, the bridge ends RTXmA and RTXmB do not face a portion between a memory pillar MPnm-9 and a memory pillar MPnm-9 that are adjacent to each other.

With the above-described structure, there is a possibility that a problem will occur in etching of the sacrificial member 62 (see FIG. 17) of the semiconductor memory device 1r. Similarly to the semiconductor memory device 1 according to the first embodiment, sacrificial members 60 to 62 of the semiconductor memory device 1r are selectively removed through slits SH. At this time, since the bridges RTX0 and RTX1 are held without being etched, part of a side surface of the sacrificial member 62 is occluded by the bridges RTX. In other words, part of the side surface of the sacrificial member 62 is in contact with the bridge RTX. A portion of the sacrificial member 62 that is in contact with the bridges RTX is etched in such a manner that a chemical detours therearound from the slits SH. Correspondingly, the portion of the sacrificial member 62 that is in contact with the bridges RTX, around which a chemical detours, takes a longer time to be etched than a portion of the sacrificial member 62 facing the slits SH.

Here, an intermediate line between two members SLT that are adjacent to each other in the XY plane may be hereinafter referred to as an "intermediate line S01". For example, an intermediate line between the member SLT0 and the member SLT1 in the Y direction may be referred to as an "intermediate line S01". The intermediate line S01 may overlap the member SHE in the XY planar view. Furthermore, a point on the intermediate line S01 having the same X coordinate as that of the center of the bridge RTX0 in the X direction may be hereinafter referred to as a "worst point W01". In other words, a point that is intermediate between the bridge end RTX0A and the bridge end RTX0B in the X direction and that is intermediate between the member SLT0 and the member SLT1 in the Y direction may be referred to as a "worst point W01". Here, the intermediate between the member SLT0 and the member SLT1 in the Y direction may include errors caused in manufacturing and a certain level of deviation, and may be referred to as "substantially intermediate" or "substantially central". Having the same X coordinate as that of the center of the bridge RTX0 in the X direction may be referred to as "substantially intermediate" or "substantially central", allowing for errors caused in manufacturing and a certain level of deviation. A worst point W01 configured of a point that allows for such errors and deviation may also allow for errors and a certain level of deviation. The worst point W01 may be defined as follows. That is, since the intermediate between the member SLT0 and the member SLT1 in the Y direction may include errors caused in manufacturing and a certain level of deviation, as described above, the intermediate between the member SLT0 and the member SLT1 in the Y direction can be regarded as a range (which may be referred to as an "intermediate range") including an intermediate between the member SLT0 and the member SLT1 in the Y direction. Also, having the same X coordinate as that of the center of the bridge RTX0 in the X direction, as described above, may be referred to as "substantially intermediate" or "substantially central", and the same X coordinate as that of the center of the bridge RTX0 in the X direction can be regarded as a range (also referred to as an "X-coordinate range") including the same X coordinate as that of the center of the bridge RTX0 in the X direction. The worst point W01 is a point in a region at which the intermediate range and the X-coordinate range intersect. Here, a point that is intermediate between the bridge end RTXnA and the bridge end RTXnB in the X direction and that is intermediate between the member SLTn and the member SLTm in the Y direction may be referred to as a "worst point Wnm".

A position at which etching is advanced slowest is the position at which it is most difficult for a chemical to reach. In the region MA01, it is most difficult for a chemical to reach a region in the vicinity of, for example, the worst point W01. This is because the worst point W01 is, in the region MA01, a point that is most distanced from the slits SH into which an etchant is introduced. That is, the worst point W01 is, in a region that faces the bridge RTX0 of the region MA01, most distanced from the slits SH in the X direction. Also, the worst point W01 is, in the region MA01, most distanced from the slits SH in the Y direction. Accordingly, the neighborhood of the worst point W01 most distanced from the slits SH in either the X direction or the Y direction is, in the region MA01, a point that is most distanced from the slits SH.

In the semiconductor memory device 1r, unlike the semiconductor memory device 1, the positions of the bridges RTX and the positions of the memory pillars MP are not taken into consideration. Thus, the semiconductor memory device 1r is configured in such a manner that a plurality of memory pillars MP are arranged on a line formed by joining the bridge end RTXA or RTXB with the worst point W. Thereby, the etchant introduced into a slit SH has to bypass a plurality of memory pillars MP to arrive at the worst point W. Since the memory pillars MP are bypassed, an etching path KR1r from the bridge end RTXA or RTXB to the worst point W further increases. FIG. 22 shows, as an example, a path of the etchant from the bridge end RTXA to the worst point W as an etching path KR1r; however, the same applies to the path of the etchant from the bridge end RTXB to the worst point W.

Due to the increase in the etching path KR1r, a problem to be described below may occur in the semiconductor memory device 1r. First, since the time necessary for etching of the sacrificial member 62 increases, a deficiency in etching may occur, causing the sacrificial member 62 to remain. Alternatively, if the etching time were increased to prevent the sacrificial member 62 from remaining, the block insulating film 45 would be exposed to the etchant for a long period of time, causing a very small amount of variations in thickness. The sacrificial member 62 remaining after the etching and the block insulating film 45 varying in thickness may cause deterioration in the performance of the semiconductor memory device 1r.

In this manner, in the case of the semiconductor memory device 1r according to the comparative example of the first embodiment in which the bridges RTX are arranged without taking into account the positional relationship with the memory pillars MP, a problem may occur in etching.

On the other hand, in the semiconductor memory device 1 according to the first embodiment, the positional relationship between the bridges RT and the memory pillars MP is designed in such a manner that a problem does not occur in etching.

As described above, the etchant is introduced from a portion (slit SH) other than the bridges RT in a region in which a member SLT is to be formed. The etching advances from the slit SH to the region MA, while bypassing the memory pillars MP. That is, the memory pillars MP may interfere with the advancement of etching of the region MA. Also, since an etchant cannot be introduced into locations where the bridges RT exist, the bridges RT may also interfere with the advancement of etching of the region MA. Therefore, a structure that is advantageous for etching of the region MA is a structure in which the bridges RT and the memory pillars MP are not arranged on a shortest etching path from the slit SH to the worst point W.

The semiconductor memory device 1 according to the first embodiment has been devised in such a manner that the bridges RT and the memory pillars MP are arranged at positions that are advantageous for etching of the region MA.

FIG. 23 shows an example of a planar layout of the memory cell array 10 in the semiconductor memory device 1 according to the first embodiment. As shown in FIG. 23, an etching path KR1 becomes a path of an etchant from the bridge end RTA or RTB to a worst point W in the semiconductor memory device 1 according to the first embodiment.

As described above, in the semiconductor memory device 1, the bridge end RTmA and/or RTmB does not face the memory pillars MPml-1 and MPnm-9 that are adjacent to the member SLTm. That is, the bridge end RTmA and/or RTmB faces a portion between a memory pillar MPml-1 and a memory pillar MPml-1 that are adjacent to each other. Also, the bridge end RTmA and/or RTmB faces a portion between a memory pillar MPnm-9 and a memory pillar MPnm-9 that are adjacent to each other. A region between memory pillars MPml-1 that face the bridge end RTmA in the Y direction may be referred to as a "region PmlA". Similarly, a region between memory pillars MPml-1 that face the bridge end RTmB in the Y direction may be referred to as a "region PmlB".

A straight line that joins the worst point Wnm and the region PnmA may be referred to as a "straight line S02". Any point in the region PnmA can be used for this joining. Similarly, a straight line that joins the worst point Wnm and the region PnmB may be referred to as a "straight line S03". Any point in the region PnmB can be used for this joining.

Since the bridge end RTmA and/or RTmB does not face the memory pillars MP, the etching path KR1 need not bypass the memory pillars MP, thus achieving a straight line. That is, a distance of the etching path KR1 can be made shorter than that of the etching path KR1r. Specifically, the etching path KR1 reaches the region PmlA from the slit SH, and then passes through the straight line S02 and reaches the worst point Wml.

Ideally, it is desirable that the memory pillars MP of the semiconductor memory device 1 not overlap the etching path KR1. However, even if one or more memory pillar MP on the etching path KR1 partially overlaps therewith to some degree, the advantageous effects of the present embodiment are exerted as long as the number of the overlapping memory pillars MP is small or the amount of the overlap is small.

[2] Modifications of First Embodiment

First Modification

In the first embodiment described above, a case has been described where a contact LI and a spacer SP are included in a portion of the member SLT other than the bridges RT; however, the structure of the member SLT is not limited thereto. For example, each member SLT may have a structure which does not include a contact LI and into which an insulator is buried over the entire portion of the member SLT other than the bridges RT.

FIG. 24 shows an example of a cross-sectional structure of the memory cell array 10 in the semiconductor memory device 1 according to a modification of the first embodiment. As shown in FIG. 24, a member SLT of the memory cell array 10 according to the modification of the first embodiment does not include a contact LI. Unlike the example shown in the first embodiment, the member SLT according to the modification of the first embodiment does not include a conductor (contact LI) at the center of the member SLT, and has a structure in which an insulator (spacer SP) is buried over the entire portion of the member SLT other than the bridges RT.

Second Modification

In the first embodiment described above, a case has been illustrated where a width of the bridge RT in the Y direction is equivalent to that of a portion of the member SLT other than the bridges RT; however, the structure of the member SLT is not limited thereto.

Figure 25:
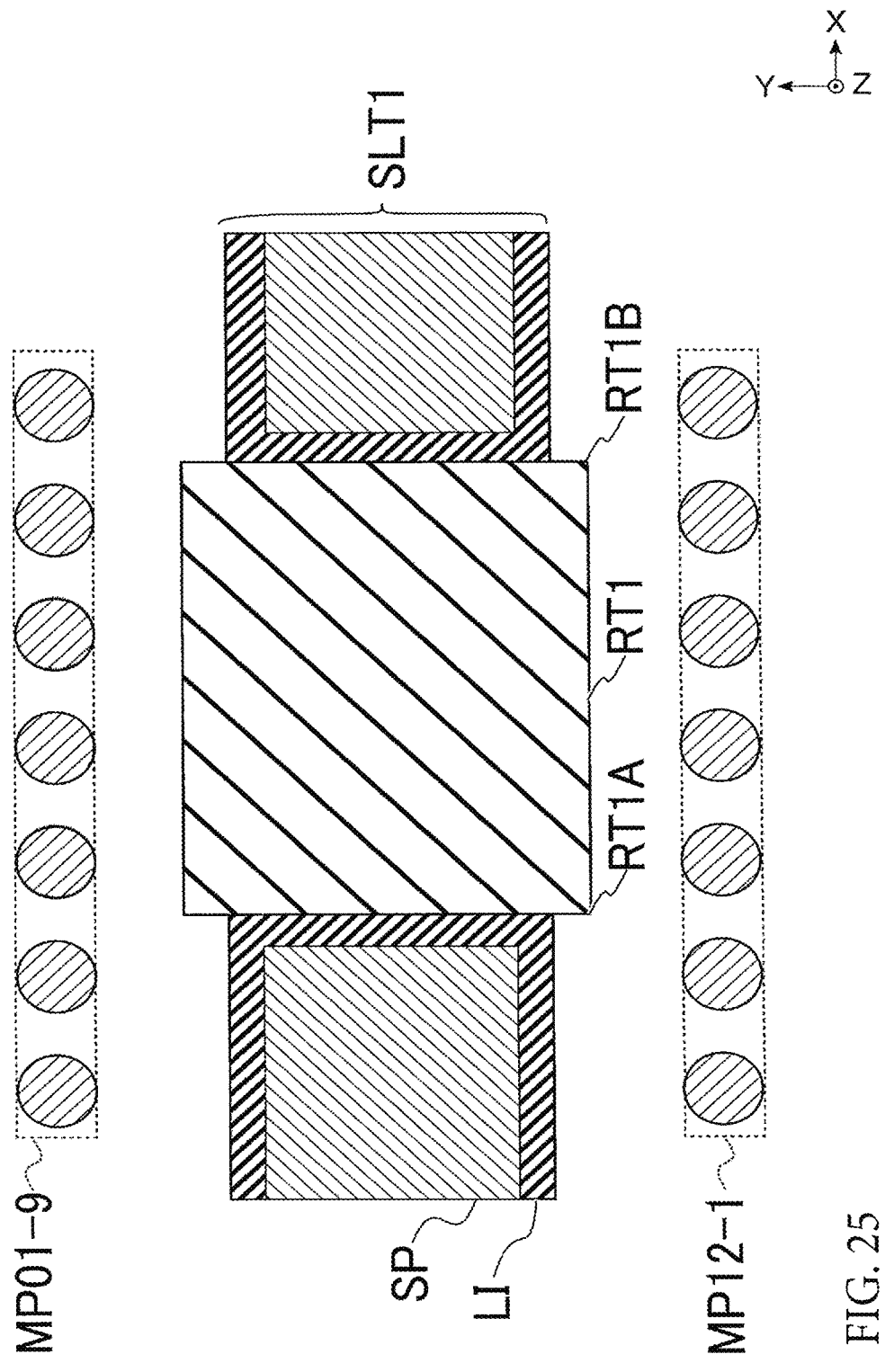
FIG. 25 shows an example of a planar layout of the memory cell array included in the semiconductor memory device 1 according to a modification of the first embodiment.

FIG. 25 shows an example of a planar layout of the memory cell array 10 in the semiconductor memory device 1 according to the modification of the first embodiment. As shown in FIG. 25, the width of the bridge RT of the memory cell array 10 according to the modification of the first embodiment in the Y direction is greater than a width of a portion of the member SLT other than the bridges RT.

As described with reference to FIGS. 15 and 16, a region in which the bridges RT are to be formed is formed by etching the entire region in which the member SLT is to be formed, burying a sacrificial member therein, and then etching again the region in which the bridges RT are to be formed. That is, the number of times the region in which the bridges RT are to be formed is etched is greater than that of the portion of the member SLT other than the bridges RT. At this time, taking into account a margin of alignment deviations in etching, the spaces 70 and 71 in FIGS. 13 and 14 may be formed to have a larger width than those of the slits SHH0 and SHH1 in FIG. 11 in the XY planar view. That is, the bridges RT may be formed to have a larger width in the XY planar view than a portion of the member SLT other than the bridges RT.

Third Modification

In the first embodiment described above, a case has been illustrated where a metallic oxide and/or a metallic material is not intervened between a bridge RT and a portion of a member SLT other than the bridges RT; however, the structure of the member SLT is not limited thereto.

FIG. 26 shows an example of a cross-sectional structure of the memory cell array 10 in the semiconductor memory device 1 according to a modification of the first embodiment. As shown in FIG. 26, the memory cell array 10 according to the modification of the first embodiment includes a metallic element containing layer which contains a metallic oxide and/or a metallic material between a bridge RT and a spacer film SP of a portion of a member SLT other than the bridges RT.

Specifically, a high dielectric film 23K is formed between the bridge RT and a portion of the member SLT other than the bridges RT, in particular, on a lower surface side of the bridges RT. The high dielectric film 23K contains, for example, a metallic oxide such as an aluminum oxide. Moreover, a conductive layer 23L is formed on a lower surface side of the high dielectric film 23K in a region between the high dielectric film 23K and the portion of the member SLT other than the bridges RT. The conductive layer 23L contains, for example, a metallic material such as tungsten, molybdenum, and/or titanium nitride.

As described with reference to FIGS. 20 and 21, the conductive layers 22 to 24 are formed after the bridges RT are formed. The high dielectric film 23K is a remainder of a metallic oxide such as aluminum oxide formed prior to the conductive layers 22 to 24 along the space from which the sacrificial members 60 to 62 have been removed, after not being completely removed from the inside of the slits SH. Similarly, the conductive layer 23L is a remainder of a metallic material contained in the conductive layers 22 to 24, after not being completely removed. The high dielectric film 23K may remain between the bridges RT and the spacer film SP on side surfaces of the bridges RT or in a given region on a side surface of the member SLT including the bridges RT and the portion other than the bridges RT.

[3] Second Embodiment

The positions of the bridges RT in the second embodiment are determined in view of the relative relationship with the positions of the memory pillars MP, similarly to the first embodiment. The positional relationship between the bridges RT and the memory pillars MP in the second embodiment has further characteristics in addition to those described in the first embodiment. Hereinafter, the characteristics that are newly added with respect to the first embodiment will be mainly described.

[3-1] Structure

The bridges RT and the memory pillars MP according to the second embodiment are similar to the bridges RT and the memory pillars MP according to the first embodiment. Hereinafter, the bridges RT and the memory pillars MP according to the second embodiment may be respectively referred to as "bridges RTb" and "memory pillars MPb" for distinction from the "bridges RT" and the "memory pillars MP" according to the first embodiment. The semiconductor memory device 1 according to the second embodiment may be referred to as a "semiconductor memory device 1b" for distinction from the semiconductor memory device 1 of the first embodiment.

FIG. 27 shows an example of a planar layout of the memory cell array 10 in the semiconductor memory device 1b according to the second embodiment. FIG. 27 shows a cross section in a layer including the conductive layer 23 in a region including the members SLT0, SLT1, and SLT2 in FIG. 4. In FIG. 27, members SHE are omitted.

A straight line that joins the region PnmA and the region PnmB may be referred to as a "straight line S04". An angle formed by the straight line S02 and the straight line S04 may be referred to as an "angle W24".

The memory pillars MP include a given memory pillar MPA, a memory pillar MPC that is adjacent to the memory pillar MPA in the X direction, and a memory pillar MPB that faces a region between the memory pillars MPA and MPC in the +Y direction. Central points of the memory pillar MPA, the memory pillar MPB, and the memory pillar MPC may be respectively referred to as central points "A", "B", and "C". Here, the "central point" refers not only to a completely central point, but allows for errors caused in measurement at the time of determination of the center, namely, the central point includes the completely central point as well as points in the periphery of the completely central point that are regarded as the center after allowing for errors. An angle formed between a straight line that connects the central points A and B and a straight line that connects the central points A and C may be referred to as an "angle CAB".

Similarly to the first embodiment, in the semiconductor memory device 1b according to the second embodiment, a bridge end RTbmA and/or RTbmB does not face memory pillars MPbml-1 and MPbnm-9 that are adjacent to the member SLTm.

In addition to the above, the semiconductor memory device 1*b* has the characteristic that the angle W24 and the angle CAB are approximately the same. Two elements being approximately the same include a situation in which the two elements are regarded as the same in the case where errors in manufacturing and/or errors in measurement have occurred.

[3-2] Advantageous Effects of Second Embodiment

With the semiconductor memory device 1*b* according to the second embodiment described above, it is possible to suppress deterioration of electronic characteristics of the memory cell transistors, similarly to the first embodiment, thus providing the semiconductor memory device 1*b* with high quality. Furthermore, the semiconductor memory device 1*b* according to the second embodiment is capable of efficiently performing etching in the periphery of the bridges RTb and the memory pillars MPb.

Similarly to the first embodiment, a bridge end RTbmA and/or RTbmB in the semiconductor memory device 1*b* does not face memory pillars MPbml-1 and MPbnm-9 that are adjacent to the member SLTm. With such a structure, the semiconductor memory device 1*b* is capable of shortening the path of the etchant from the bridge end RTbA and/or RTbB to the worst point W, compared to the semiconductor memory device 1*r* according to the comparative example of the first embodiment.

In addition to the above, the semiconductor memory device 1*b* has the characteristic that the angle W24 and the angle CAB are approximately the same (see FIG. 27). Such a structure allows the semiconductor memory device 1*b* to further etch the sacrificial member 62.

If, for example, the angle CAB greatly differed from the angle W24, a large number of memory pillars MP would overlap the straight lines S02 and S03. In this case, the path of the etchant from the bridge end RTbA and/or RTbB to the worst point W would bypass the memory pillars MP, as in the etching path KR1*r* in FIG. 22.

When the angle CAB and the angle W24 are approximately the same, the number of memory pillars MP that overlap the straight lines S02 and S03 can be reduced, compared to when the angle CAB and the angle W24 are different. That is, the semiconductor memory device 1*b* according to the second embodiment is capable of efficiently performing etching in the periphery of the bridges RTb and the memory pillars MPb.

[4] Third Embodiment

The positions of the bridges RT in the third embodiment are determined in view of the relative relationship with the positions of the memory pillars MP, similarly to the first and second embodiments. The positional relationship between the bridges RT and the memory pillars MP in the third embodiment has further characteristics in addition to those described in the second embodiment. Hereinafter, the characteristics that are newly added with respect to the second embodiment will be mainly described.

[4-1] Structure

The bridges RT and the memory pillars MP according to the third embodiment are similar to the bridges RT and the memory pillars MP according to the first embodiment. Hereinafter, the bridges RT and the memory pillars MP according to the third embodiment may be respectively referred to as "bridges RTc" and "memory pillars MPc" for distinction from the "bridges RT" and the "memory pillars MP" according to the first embodiment. The semiconductor memory device 1 according to the third embodiment may be referred to as a "semiconductor memory device 1*c*" for distinction from the semiconductor memory device 1 of the first embodiment.

FIG. 28 shows an example of a planar layout of the memory cell array 10 in the semiconductor memory device 1*c* according to the third embodiment. FIG. 28 shows a cross section in a layer including the conductive layer 23 in a region including the members SLT0, SLT1, and SLT2 in FIG. 4. In FIG. 28, members SHE are omitted.

A triangle configured by a straight line S02, a straight line S03, and a straight line S04 may be referred to as a "triangle 23W". Also, a triangle configured by central points A, B and C may be referred to as a "triangle ABC". Moreover, an angle formed by a straight line that connects the central points A and B and a straight line that connects the central points B and C may be referred to as an "angle ABC". Furthermore, an angle formed by a straight line that connects the central points B and C and a straight line that connects the central points A and C may be referred to as an "angle ACB". Here, the "central point" refers not only to a completely central point, but allows for errors caused in measurement at the time of determination of the center, namely, the central point includes the completely central point as well as points in the periphery of the completely central point that are regarded as the center after allowing for errors.

Similarly to the first embodiment, in the semiconductor memory device 1*c* according to the third embodiment, the bridge end RTcmA and/or RTcmB does not face memory pillars MPcml-1 and MPcnm-9 that are adjacent to the member SLTm.

In addition to the above, the semiconductor memory device 1*c* has the characteristic that the triangle 23W and the triangle ABC are substantially similar. Details will be described below. A ratio of a side on the straight line S02 to a side AB of the triangle 23W, a ratio of a side on the straight line S03 to the side BC of the triangle 23W, and a ratio of a side on the straight line S04 to the side CA of the triangle 23W are substantially equal. Also, an angle formed by the straight line S02 and the straight line S03 and an angle ABC are approximately the same, and an angle formed by the straight line S03 and the straight line S04 and the angle ACB are approximately the same. Two elements being approximately the same include a situation in which the two elements are regarded as the same in the case where errors in manufacturing and/or errors in measurement have occurred.

[4-2] Advantageous Effects of Third Embodiment

With the semiconductor memory device 1*c* according to the third embodiment described above, it is possible to suppress deterioration of electronic characteristics of the memory cell transistors, similarly to the first embodiment, thus providing the semiconductor memory device 1*c* with high quality. Furthermore, the semiconductor memory device 1*c* according to the third embodiment is capable of efficiently performing etching in the periphery of the bridges RTC and the memory pillars MPc.

Similarly to the first embodiment, a bridge end RTcmA and/or RTcmB in the semiconductor memory device 1*c* does not face memory pillars MPcml-1 and MPcnm-9 that are adjacent to the member SLTm. With such a structure, in the semiconductor memory device 1c, it is possible to shorten the path of the etchant from the bridge end RTcA and/or RTcB to the worst point W, compared to the semiconductor memory device 1r according to the comparative example of the first embodiment.

In addition to the above, the semiconductor memory device 1c has the characteristic that the triangle 23W and the triangle ABC are approximately similar, and the ratios of three sides of the triangles 23W and ABC are approximately the same (see FIG. 28). Such a structure allows the semiconductor memory device 1c to further etch the sacrificial member 62.

For example, if the ratios of the three sides of the triangles 23W and ABC differ greatly, a large number of memory pillars MP would overlap the straight lines S02 and S03. In this case, the path of the etchant from the bridge end RTcA and/or RTcB to the worst point W would bypass the memory pillars MP, as in the etching path KR1r in FIG. 22.

When the ratios of the three sides of the triangle 23W and the triangle ABC are approximately the same, the number of memory pillars MP that overlap the straight lines S02 and S03 can be reduced, compared to when the ratios of the three sides of the triangles 23W and ABC differ. That is, the semiconductor memory device 1c according to the third embodiment is capable of efficiently performing etching in the periphery of the bridges RTc and the memory pillars MPc.

[5] Fourth Embodiment

The positions of the bridges RT in the fourth embodiment are determined in view of the relative relationship with the positions of the memory pillars MP, similarly to the first embodiment. The bridges RT in the fourth embodiment differ from the bridges RT in the first embodiment mainly in terms of the structure. Hereinafter, the characteristics that are newly added with respect to the first embodiment will be mainly described.

[5-1] Structure

The bridges RT in the fourth embodiment differ from the bridges RT in the first embodiment in terms of the length in the Z direction, in particular. Hereinafter, the bridges RT and the memory pillars MP according to the fourth embodiment may be respectively referred to as "bridges RTd" and "memory pillars MPd" for distinction from the "bridges RT" and the "memory pillars MP" according to the first embodiment. The semiconductor memory device 1 according to the fourth embodiment may be referred to as a "semiconductor memory device 1d" for distinction from the semiconductor memory device 1 of the first embodiment.

FIG. 29 shows an example of a planar layout of the memory cell array 10 in the semiconductor memory device 1d according to the fourth embodiment. FIG. 29 shows a region including members SLT0, SLT1, and SLT2 in FIG. 4. In FIG. 29, members SHE are omitted.

The fourth embodiment and FIG. 29 are based on an example in which bridges RTd do not face each other in the Y direction in adjacent members SLT. In a single member SLT, a plurality of bridges RTd are intermittently arranged in the X direction. The bridges RTd in each member SLT may or may not be arranged at equal intervals in the X direction.

Similarly to the semiconductor memory device 1 of the first embodiment, a bridge end RTdmA and/or RTdmB of the member SLTm does not face memory pillars MPdml-1 and MPdnm-9 that are adjacent to the member SLTm. That is, the bridge end RTdmA and/or RTdmB faces a portion between a memory pillar MPdml-1 and a memory pillar MPdml-1 that are adjacent to each other. Also, the bridge end RTdmA and/or RTdmB faces a portion between a memory pillar MPdnm-9 and a memory pillar MPdnm-9 that are adjacent to each other. In other words, at least one of the bridge ends RTdmA and RTdmB is provided to not face memory pillars MPdml-1 and MPdnm-9 that are adjacent to the member SLTm.

FIG. 30 is a cross-sectional diagram taken along line XXX-XXX of FIG. 29, showing an example of a cross-sectional structure of the memory cell array 10 included in the semiconductor memory device 1d according to the fourth embodiment. As shown in FIG. 30, each bridge RTd extends in the Z direction and penetrates through the conductive layers 22 to 24, similarly to a portion of the member SLT other than the bridges RTd. An upper end of the bridge RTd is in contact with the insulating layer 34. A lower end of the bridge RTd is in contact with, for example, the conductive layer 21. The bridge RTd includes, for example, an insulator such as silicon oxide. In this manner, the bridge RTd has a longer length in the Z direction than the bridge RT.

Since the other structures are similar to those of the first embodiment, the description in the first embodiment applies, and a detailed description will be omitted.

Similarly to the first embodiment, the bridge RTd may be formed to have a larger width in the XY planar view than a portion of the member SLT other than the bridges RTd. Also, a metallic element containing layer formed of a metallic oxide which is a material for forming a high dielectric film and/or a metallic material contained in the conductive layers 22-24 may be formed between the bridge RTd and a portion of the member SLT other than the bridges RTd.

[5-2] Advantageous Effects of Fourth Embodiment

With the semiconductor memory device id according to the fourth embodiment described above, it is possible to suppress deterioration of electronic characteristics of the memory cell transistors, similarly to the first embodiment, thus providing the semiconductor memory device 1d with high quality. Furthermore, with the semiconductor memory device 1d according to the fourth embodiment, it is possible to efficiently prevent the slits SH from being narrowed, compared to the semiconductor memory device 1 according to the first embodiment.

Similarly to the first embodiment, a bridge end RTdmA and/or RTdmB of the semiconductor memory device 1d does not face memory pillars MPdml-1 and MPdnm-9 that are adjacent to the member SLTm. With such a structure, the semiconductor memory device 1d is capable of shortening the path of the etchant from the bridge end RTdA and/or RTdB to the worst point W, compared to the semiconductor memory device 1r according to the comparative example of the first embodiment.

In addition to the above, the semiconductor memory device 1d has the characteristic that the bridge RTd has a greater length in the Z direction than the bridge RT. With such a structure, the semiconductor memory device 1d is capable of further efficiently preventing the slits SH from being narrowed, compared to the semiconductor memory device 1.

Specifically, when a stress that would narrow a slit SH is applied, it is possible to efficiently prevent the narrowing when the bridge RTd extends to a lower portion of the slit SH, compared to when the bridge RT exists only in an upper portion thereof. Moreover, it is possible to efficiently prevent the stack structure from being broken down when the bridge RTd extends to a lower portion of the slit SH.

[6] Fifth Embodiment

The positions of bridges RT in the fifth embodiment are determined in view of the relative relationship with the positions of the memory pillars MP, similarly to the first embodiment. The bridges RT in the fifth embodiment differ from the bridges RT in the first embodiment mainly in terms of the intervals at which the bridges RT are arranged in the member SLT. Hereinafter, the characteristics that are newly added with respect to the first embodiment will be mainly described.

[6-1] Structure

The bridges RT according to the fifth embodiment in the XY planar view differ from the bridges RT according to the first embodiment in terms of the positions in the memory cell array 10. Hereinafter, the bridges RT and the memory pillars MP according to the fifth embodiment may be respectively referred to as "bridges RTe" and "memory pillars MPe" for distinction from the "bridges RT" and the "memory pillars MP" according to the first embodiment. The semiconductor memory device 1 according to the fifth embodiment may be referred to as a "semiconductor memory device 1e" for distinction from the semiconductor memory device 1 of the first embodiment.

Figure 31:
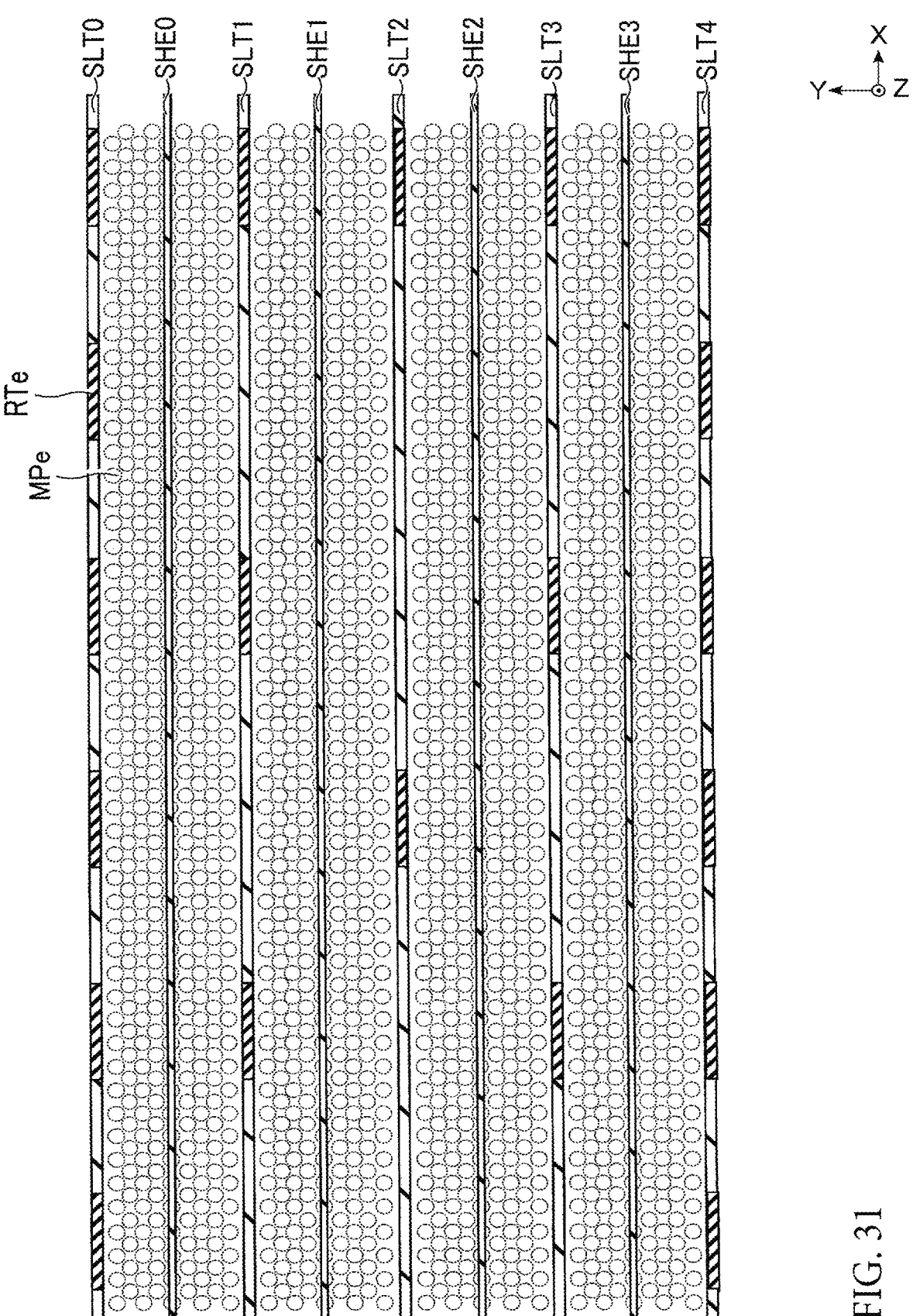
FIG. 31 is a plane diagram showing an example of a planar layout of a memory cell array included in a semiconductor memory device 1e according to a fifth embodiment.

FIG. 31 is a plane diagram showing an example of a planar layout of the memory cell array 10 included in the semiconductor memory device 1e according to the fifth embodiment. In FIG. 31, a region similar to that shown in FIG. 4 is shown to show a positional relationship of bridges RTe in the memory cell array 10. As shown in FIG. 31, the intervals at which the bridges RTe are arranged in the member SLT differ according to the member SLT.

Specifically, the number of bridges RTe in a member SLT that is arranged at a central portion (FIG. 31) of the memory cell array 10, such as the member SLT2, is smaller than that in a member SLT arranged at an end side of the memory cell array 10, such as the member SLT0 and the member SLT4. That is, the number of bridges RTe arranged in each of the members SLT1 and SLT3 is larger than that in the member SLT2. Moreover, the number of bridges RTe arranged in each of the members SLT0 and SLT4 is larger than that in each of the members SLT1 and SLT3. The number of bridges RTe arranged in each of the members SLT1 and SLT3 may be the same as the number of bridges RTe arranged in each of the members SLT0 and SLT4, or the number of bridges RTe arranged in the member SLT2.

Since the other structures are similar to those of the first embodiment, the description in the first embodiment applies, and a detailed description will be omitted.

[6-2] Advantageous Effects of Fifth Embodiment

With the semiconductor memory device 1e according to the fifth embodiment described above, it is possible to suppress deterioration of electronic characteristics of the memory cell transistors, similarly to the first embodiment, thus providing the semiconductor memory device 1e with high quality. Furthermore, the semiconductor memory device 1e according to the fifth embodiment is capable of efficiently preventing narrowing of the slits SH, while efficiently performing etching in the periphery of the bridges RTe and the memory pillars MPe.

Similarly to the first embodiment, a bridge end RTemA and/or RTemB in the semiconductor memory device 1e does not face memory pillars MPeml-1 and MPenm-9 that are adjacent to the member SLTm. With such a structure, the semiconductor memory device 1e is capable of shortening the path of the etchant from the bridge end RTeA and/or RTeB to the worst point W, compared to the semiconductor memory device 1r according to the comparative example of the first embodiment.

In addition to the above, the semiconductor memory device 1e has the characteristic that the intervals at which the bridges RTe are arranged in the member SLT differ according to the member SLT. With such a structure, the semiconductor memory device 1e is capable of efficiently preventing narrowing of the slits SH, while efficiently performing etching in the periphery of the bridges RTe and the memory pillars MPe.

Narrowing of a slit SH is likely to occur on end sides of the memory cell array 10 at which a difference in stress is likely to occur with the slit SH interposed therebetween. In the case of a slit SH arranged in the central portion of the memory cell array 10, a difference in stress is not likely to occur through interposition of the slit SH. Thus, to prevent the slits SH from being narrowed, it is more effective to provide a low number of bridges RTe in the central portion and a large number of bridges RTe on end sides of the memory cell array 10.

[7] Other Modifications, Etc.

In the first to fifth embodiments, the structure of each of the semiconductor memory devices 1 to 1e may have a structure other than those described above.

Herein, the term "couple" refers to electrical connection, and does not exclude intervention of another element. The "electrical coupling" may be intervened by an insulator as long as such coupling is capable of operating in a manner similar to the electrical coupling without intervention of an insulator. The terms "substantially the same", "approximately the same", and "substantially equal" include errors caused by variations in manufacturing.

The first to fifth embodiments described above have been presented by way of example only, and are not intended to limit the scope of the invention. The first to fifth embodiments may be embodied in a variety of other forms, and various omissions, substitutions and variations may be made without departing from the spirit of the invention. The first to fifth embodiments and its modifications are included in the scope and spirit of the invention and are included in the scope of the claimed inventions and their equivalents.

The invention claimed is:

1. A semiconductor memory device, comprising:
   a base layer which extends in a first plane that intersects a first direction;
   a first conductive layer which is provided above the base layer in the first direction;
   a first member which extends in a second direction above the base layer in the first direction, and which divides the first conductive layer in a third direction that intersects the first direction and the second direction, the second direction intersecting the first direction;

a second member which is aligned with the first member in the third direction, which extends in the second direction above the base layer in the first direction, and which divides the first conductive layer in the third direction; and a plurality of pillars which penetrate the first conductive layer in the first direction, and which form memory cells at intersections with the first conductive layer, wherein the first member includes a first portion which is arranged locally on an upper end side and intermittently in the second direction, the plurality of pillars include:

a first pillar;

a second pillar which is adjacent to the first pillar in the second direction on a side of the second direction of the first pillar;

a third pillar which faces a first region in the third direction, the first region being between the first pillar and the second pillar;

a fourth pillar which is adjacent to the third pillar in the second direction on a side of the second direction of the third pillar;

a fifth pillar which faces a second region in the third direction, the second region being between the third pillar and the fourth pillar; and a sixth pillar which is adjacent to the fifth pillar in the second direction on a side of the second direction of the fifth pillar, the first pillar and the second pillar face the first member, a first end of the first portion faces the first region, the first region, the second region, and a third region are positioned on an identical straight line, the third region being between the fifth pillar and the sixth pillar, a fourth region which is substantially central to a length of the first portion in the second direction, which is substantially central between the first member and the second member in the third direction, and which is positioned on a straight line that joins at least two of the first region, the second region, and the third region, the plurality of pillars further include:

a seventh pillar which faces the first member;

an eighth pillar which is adjacent to the seventh pillar in the second direction on a side of the second direction of the seventh pillar, and which faces the first member;

a ninth pillar which faces a fifth region in the third direction, the fifth region being between the seventh pillar and the eighth pillar; and a tenth pillar which is adjacent to the ninth pillar in the second direction on a side of the second direction of the ninth pillar, a second end of the first portion faces the fifth region, and the fourth region is positioned on a straight line which joins the fifth region and a sixth region between the ninth pillar and the tenth pillar.

2. The semiconductor memory device according to claim 1, wherein an angle formed by a line which connects a center of the first pillar and a center of the second pillar and a line which connects a center of the third pillar and the center of the first pillar as viewed from the first direction is a first angle, an angle formed by a line which connects the fourth region and the first region and a straight line which passes through the first region and goes along the second direction as viewed from the first direction is a second angle, and the first angle and the second angle are approximately identical.

3. The semiconductor memory device according to claim 1, wherein the plurality of pillars are arranged in an approximately linear symmetry with the first member interposed therebetween.

4. The semiconductor memory device according to claim 1, wherein the first member further includes a metallic element containing layer between the first portion and a portion other than the first portion.

5. The semiconductor memory device according to claim 4, wherein the first member includes the metallic element containing layer containing at least one of a metallic oxide and a metallic material contained in the first conductive layer between the first portion and a second portion which is below the first portion in the first direction.

6. The semiconductor memory device according to claim 1, wherein a width of the first portion in the third direction differs from a width of another portion of the first member in the third direction.

7. The semiconductor memory device according to claim 1, wherein the first member further includes:

a second portion below the first portion in the first direction; and a third portion which differs from the first and second portions, the first portion includes an insulator, the second portion includes a first sub conductor and a first sub insulator, the first sub insulator being provided between the first sub conductor and the first conductive layer, and the third portion includes a second sub conductor and a second sub insulator, the second sub insulator being provided between the second sub conductor and the first conductive layer.

8. The semiconductor memory device according to claim 1, wherein the first portion is formed of an insulator.

9. The semiconductor memory device according to claim 2, wherein a distance between the center of the first pillar and the center of the second pillar as viewed from the first direction is a first distance, a distance between the center of the third pillar and the center of the first pillar as viewed from the first direction is a second distance, a length of the first portion in the second direction is a first length, a distance between the fourth region and the first region as viewed from the first direction is a third distance, and a ratio between the first distance and the second distance is approximately identical to a ratio between the first length and the third distance.

10. A semiconductor memory device, comprising:

a lower-layer conductive layer;

a first conductive layer provided above the lower-layer conductive layer in the first direction;

a first member which extends along a second direction above the lower-layer conductive layer in the first direction, and which divides the first conductive layer in a third direction that intersects the first direction and the second direction, the second direction intersecting the first direction;

a second member which is aligned with the first member in the third direction, which extends in the second direction above the lower-layer conductive layer in the first direction, and which divides the first conductive layer in the third direction; and a plurality of pillars which penetrate the first conductive layer in the first direction, which include a semiconductor layer that is in contact with the lower-layer conductive layer, and which form memory cells at intersections with the first conductive layer, wherein the first member includes a first portion which penetrates the first conductive layer in the first direction and reaches the lower-layer conductive layer, and which is intermittently arranged in the second direction, the plurality of pillars include:

a first pillar;

a second pillar which is adjacent to the first pillar in the second direction on a side of the second direction of the first pillar;

a third pillar which faces a first region in the third direction, the first region being between the first pillar and the second pillar;

a fourth pillar which is adjacent to the third pillar in the second direction on a side of the second direction of the third pillar;

a fifth pillar which faces a second region in the third direction, the second region being between the third pillar and the fourth pillar; and a sixth pillar which is adjacent to the fifth pillar in the second direction on a side of the second direction of the fifth pillar, the first pillar and the second pillar face the first member, a first end of the first portion faces the first region, the first region, the second region, and a third region are positioned on an identical straight line, the third region being between the fifth pillar and the sixth pillar, a fourth region which is substantially central to a length of the first portion in the second direction, which is substantially central between the first member and the second member in the third direction, and which is positioned on a straight line that joins at least two of the first region, the second region, and the third region, the plurality of pillars further include:

a seventh pillar which faces the first member;

an eighth pillar which is adjacent to the seventh pillar in the second direction on a side of the second direction of the seventh pillar, and which faces the first member;

a ninth pillar which faces a fifth region in the third direction, the fifth region being between the seventh pillar and the eighth pillar; and a tenth pillar which is adjacent to the ninth pillar in the second direction on a side of the second direction of the ninth pillar, a second end of the first portion faces the fifth region, and the fourth region is positioned on a straight line which joins the fifth region and a sixth region between the ninth pillar and the tenth pillar.

11. The semiconductor memory device according to claim 10, wherein an angle formed by a line which connects a center of the first pillar and a center of the second pillar and a line which connects a center of the third pillar and the center of the first pillar as viewed from the first direction is a first angle, an angle formed by a line which connects the fourth region and the first region and a straight line which passes through the first region and goes along the second direction as viewed from the first direction is a second angle, and the first angle and the second angle are approximately identical.

12. The semiconductor memory device according to claim 10, wherein the plurality of pillars are arranged in an approximately linear symmetry with the first member interposed therebetween.

13. The semiconductor memory device according to claim 10, wherein the first member further includes a metallic element containing layer between the first portion and a portion other than the first portion.

14. The semiconductor memory device according to claim 10, wherein a width of the first portion in the third direction differs from a width of another portion of the first member in the third direction.

15. The semiconductor memory device according to claim 10, wherein the first portion includes an insulator, and a portion of the first member other than the first portion includes a sub conductor and a sub insulator, the sub insulator being provided between the sub conductor and the first conductive layer.

16. The semiconductor memory device according to claim 10, wherein the first portion is formed of an insulator.

* * * * *